United States Patent
Fukae et al.

(10) Patent No.: US 7,539,338 B2
(45) Date of Patent: May 26, 2009

(54) BUMP INSPECTION APPARATUS AND METHOD FOR IC COMPONENT, BUMP FORMING METHOD FOR IC COMPONENT, AND MOUNTING METHOD FOR IC COMPONENT

(75) Inventors: Takayuki Fukae, Settsu (JP); Yoichiro Ueda, Osaka (JP); Tetsushirou Torigoe, Fujisawa (JP)

(73) Assignee: Panasonic Corporation, Osaka (JP)

( * ) Notice: Subject to any disclaimer, the term of this patent is extended or adjusted under 35 U.S.C. 154(b) by 534 days.

(21) Appl. No.: 11/137,587

(22) Filed: May 26, 2005

(65) Prior Publication Data

US 2006/0040442 A1    Feb. 23, 2006

(30) Foreign Application Priority Data

Jun. 1, 2004    (JP)    ............... 2004-162919

(51) Int. Cl.
    *G06K 9/00*    (2006.01)
(52) U.S. Cl. ............... 382/145; 382/147; 382/149; 382/150; 382/151
(58) Field of Classification Search ............... 382/145, 382/146, 147, 149, 150, 151
    See application file for complete search history.

(56) References Cited

U.S. PATENT DOCUMENTS

| | | | | |
|---|---|---|---|---|
| 5,058,178 A | * | 10/1991 | Ray | ............... 382/150 |
| 6,201,892 B1 | * | 3/2001 | Ludlow et al. | ............... 382/149 |
| 6,547,409 B2 | * | 4/2003 | Kiest et al. | ............... 362/33 |
| 6,608,921 B1 | * | 8/2003 | Inoue et al. | ............... 382/146 |
| 6,671,397 B1 | * | 12/2003 | Mahon et al. | ............... 382/145 |
| 6,828,772 B1 | * | 12/2004 | Hofer et al. | ............... 324/158.1 |
| 6,862,365 B1 | * | 3/2005 | Beaty et al. | ............... 382/145 |
| 7,052,984 B2 | * | 5/2006 | Narita et al. | ............... 438/613 |

FOREIGN PATENT DOCUMENTS

| | | |
|---|---|---|
| JP | 10-242219 | 9/1998 |
| JP | 2000-114297 | 4/2000 |
| WO | WO-0004488 A1 * | 1/2000 |
| WO | WO-0212870 A3 * | 2/2002 |

OTHER PUBLICATIONS

Loh et al., 'Printed Circuit Board Inspection Using Image Analysis', May 1995, Industrial Automation and Control: Emerging Technologies, IEEE, pp. 673-677.*

Odawara et al., 'An Integrated Visual System for Solder Inspection', Nov. 1988, International conference on Pattern Recognition, IEEE, vol. 2, pp. 291-294.*

* cited by examiner

*Primary Examiner*—John B Strege
*Assistant Examiner*—Srirama Channavajjala
(74) *Attorney, Agent, or Firm*—Wenderoth, Lind & Ponack, L.L.P.

(57) ABSTRACT

Unidirectional light is radiated onto a bump-formation surface of an IC component to acquire a first overall image of the IC component, light is radiated onto the bump-formation surface in inclined directions to acquire a second overall image. First bump inspection images are respectively acquired from the first overall image, and second bump inspection images are respectively acquired from the second overall image. Then bump-formation positions are inspected based on the second bump inspection images, and degrees of crush of bump vertex portions are inspected based on the respective first bump inspection images. Hereby, bump inspection with high precision and efficiency is achieved.

15 Claims, 23 Drawing Sheets

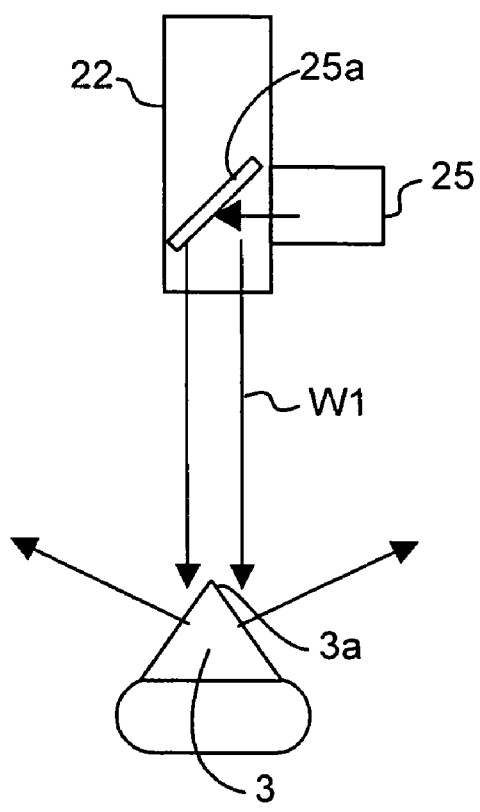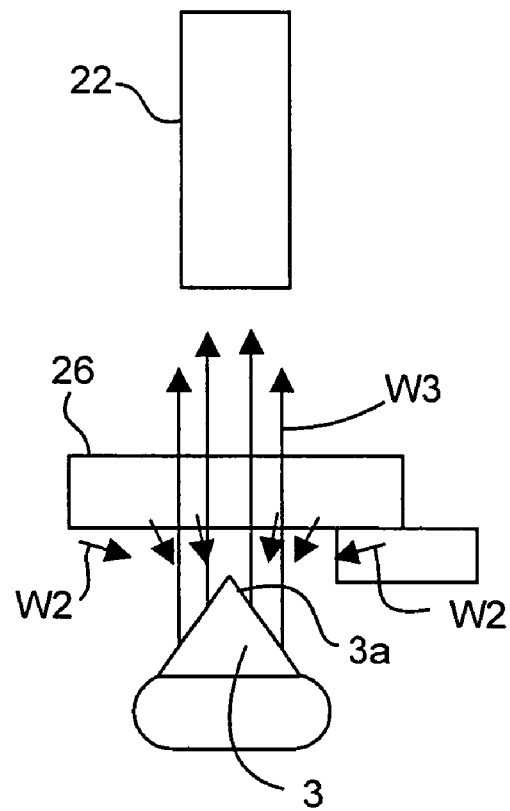

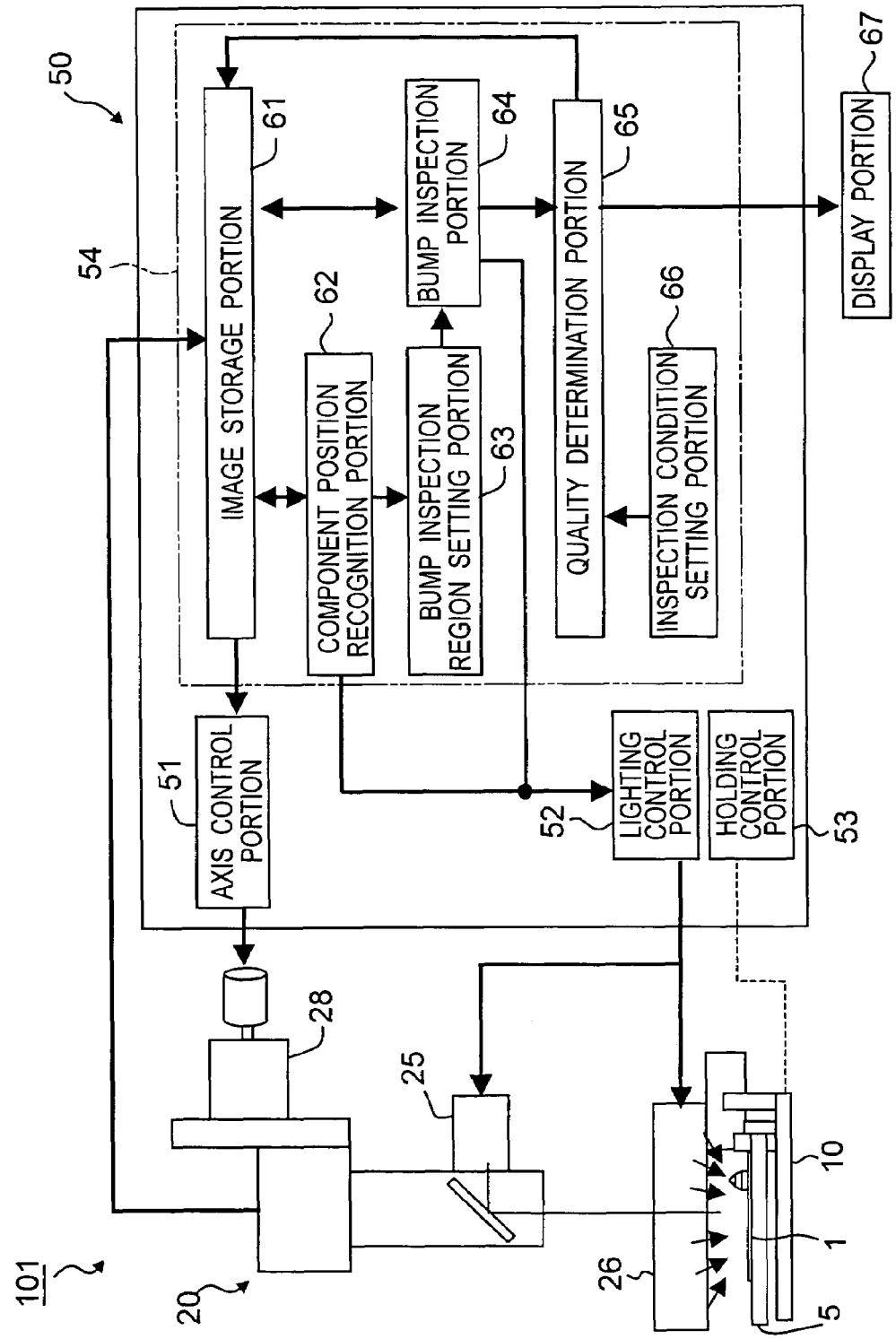

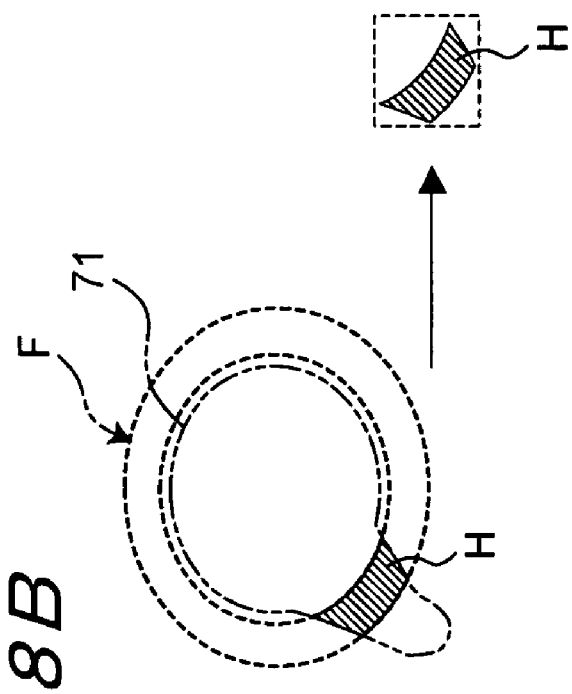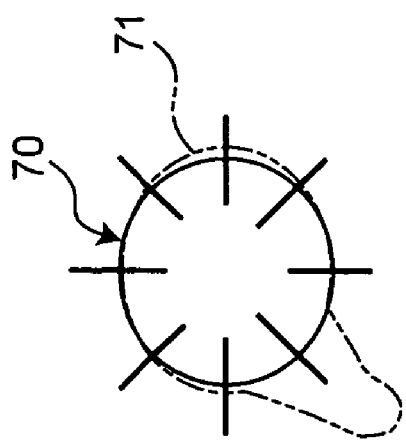

BUMP INSPECTION APPARATUS AND METHOD FOR IC COMPONENT, BUMP FORMING METHOD FOR IC COMPONENT, AND MOUNTING METHOD FOR IC COMPONENT

BACKGROUND OF THE INVENTION

1. Technical Field

The present invention relates to an apparatus and a method for bump inspection in which images of respective bumps formed on electrode pads on a semiconductor bare chip are acquired, and the acquired images are processed for inspection of the formation states of the respective bumps. The present invention further relates to a bump formation method and an IC component mounting method using such a bump inspection method.

2. Description of the Related Art

Conventionally, various inspection methods for respective bumps on this kind of semiconductor bare chips, i.e., IC components, are known. For example, there is an inspection method in which respective bumps are formed on each bump-formation surface of a plurality of IC components, and directly thereafter images showing the formation states of the respective bump are picked up, and the respective images are processed for inspection of the formation state of the respective bumps (see, e.g., Japanese unexamined patent publication No. H10-242219 A).

A description will be given of such a conventional inspection method. A single IC component is taken out of a plurality of IC components stored in a component tray, and is moved to a bump-formation position. A plurality of bumps are formed on the bump-formation surface of the IC component disposed in the bump-formation position.

Then, the IC component having bumps formed thereon is moved to an image-pickup position in which image pickup is performed for inspection of the bumps. In the image-pickup position, an image-pickup camera and a single bump on the IC component is aligned and an image of the single bump is picked up by the image-pickup camera. Then, on the IC component, the next bump and the image-pickup camera are aligned and an image of the next bump is picked up. In similar procedures, images of the respective bumps are picked up.

After that, recognition processing of the respective picked-up images is performed so that the formation positions of the respective bumps are inspected, and based on the result of the inspection, the quality of the formation states of the respective bumps is determined.

SUMMARY OF THE INVENTION

In recent years, in the field of electronic equipment incorporating boards with IC components mounted thereon, which are formed by mounting such IC components on the boards, achieving higher precision while reducing manufacturing costs has been required. As a result, it is also required that bumps for mounting respective IC components on a board are formed with more quality and higher precision, while at the same time, it is expected that such respective bumps are inspected with high precision and efficiency.

However, in a conventional inspection method, inspection of respective bumps is performed in such a way that each individual bump on an IC component is individually aligned with an image-pickup camera, while an image of each individual bump is acquired and is subjected to recognition processing. Because of the time necessary for the alignment and the time necessary for the image pickup, reduction of the time necessary for inspection is difficult. Further, in recent years, with development of highly functional IC components, the quantity of bumps formed tends to increase, and in this trend, a time necessary for inspection of respective bumps is prolonged, which causes the problem of further difficulty in efficient inspection.

Further in such a bump inspection, an image of each individual bump is acquired in the state wherein the IC component is fully secured. In the secured state, however, the IC component is directly touched, which causes the problem that a vertex portion of the bump may be damaged or the IC component itself develops cracks.

Moreover, the alignment between each individual bump and the image-pickup camera is performed in this way by relative movement of the camera and the IC component, and therefore displacements caused by this movement are included in the precision of bump position recognition achieved through image processing, which may cause difficulty in high-accuracy inspection.

Moreover, in the case where an efficient and accurate bump inspection cannot be performed, efficiency in mounting the IC components on the board is also diminished.

Accordingly, an object of the present invention is to provide, for solving these problems, a bump inspection apparatus and method for IC components capable of implementing high-precision and efficient inspection, in which images of respective bumps formed on electrode pads on an IC component are acquired, and the acquired images are processed for inspection of the respective bumps, as well as to provide a bump formation method for IC components and an IC component mounting method using the result of such inspection.

In order to achieve the above object, the present invention has the following constitutions.

According to a first aspect of the present invention, a bump inspection apparatus is provided for IC components, comprising:

a housing-member holding device for holding a component housing member which houses a plurality of IC components each having a plurality of bumps formed thereon, in a state of being arranged in an array with respective bump-formation surfaces facing up;

an image-pickup device for picking up images of the respective IC components which are housed in the component housing member held by the housing-member holding device; and a control device for controlling an image-pickup operation by the image-pickup device, a holding operation by the housing-member holding device, and inspection processing of the respective bumps by using the picked up images, wherein the image-pickup device comprises:
an image-pickup camera unit for individually picking up an overall image of the IC component on the bump-formation surface along an optical axis disposed in a direction approximately orthogonal to directions approximately along the bump-formation surface; and
an image-pickup optical-axis positioning unit for aligning the optical axis of the image-pickup camera unit and an almost center position on the bump-formation surface of the IC component which is an image-pickup target, the control device comprises:
a component position recognition portion for recognizing a position of the IC component aligned by the image pickup optical axis alignment portion on a basis of the overall image picked up by the image-pickup camera unit;
a bump inspection region setting portion for setting inspection regions of the respective bumps, whose arrangement is preset on a basis of formation positions of the respective bumps on the IC component, by positioning the inspection regions on the overall image on a basis of a recognition result by the component position recognition portion, and thereby acquiring bump inspection images of the respective bumps from the overall image; and an inspection processing portion for performing inspection processing for the formation positions of the respective bumps on a basis of the respective bump inspection images and performing inspection processing for degrees of crush of vertex portions of the respective bumps.

According to a second aspect of the present invention, the bump inspection apparatus for IC components as defined in the first aspect is provided, wherein the image-pickup device further comprises a lighting device having a unidirectional-light irradiating unit for radiating almost unidirectional light along the optical axis onto the bump-formation surface of the IC component and an inclined-directional-light irradiating unit for radiating light along a plurality of directions from a surrounding of the optical axis disposed on the bump-formation surface toward the optical axis, the respective directions being inclined to the bump-formation surface, the control device further comprises an image storage portion for receiving inputs of and readably storing a first overall image of the IC component which is picked up by the image-pickup camera unit while the unidirectional light is radiated by the unidirectional-light irradiating unit onto the bump-formation surface of the IC component, and a second overall image of the IC component which is picked up by the image-pickup camera unit while the inclined-directional light is radiated by the inclined-directional-light irradiating unit onto the bump-formation surface, in the state wherein the bump-formation surface is aligned with the optical axis by the image-pickup optical-axis positioning unit, the component position recognition portion reads the first overall image or the second overall image stored in the image storage portion and recognizes a position of the IC component on a basis of the read image, the bump inspection region setting portion reads the first overall image and the second overall image from the image storage portion so as to acquire first bump inspection images of the respective bumps from the first overall image and so as to acquire second bump inspection images of the respective bumps from the second overall image, and the inspection processing portion performs inspection processing for the formation positions of the respective bumps on a basis of the respective first bump inspection images or second bump inspection images and performs inspection processing for the degrees of crush of the vertex portions of the respective bumps on a basis of the respective first bump inspection images.

According to a third aspect of the present invention, the bump inspection apparatus for IC components as defined in the second aspect is provided, wherein in the control device, the inspection processing portion performs inspection processing for the formation positions of the respective bumps on a basis of the respective second bump inspection images.

According to a fourth aspect of the present invention, the bump inspection apparatus for IC components as defined in the first aspect is provided, wherein the housing-member holding device comprises:

a pair of support members for supporting lower parts of both end portions of the component housing member opposed to each other;

a pair of pressing-and-holding members for holding a supported posture of the component housing member while pressing the respective end portions of the component housing member, the component housing member being in the state of being supported by the respective support members, from an upper side so as to correct warp or deflection of the component housing member and to keep an approximately horizontal posture; and a pressing-and-holding member movement device for integrally moving the respective pressing-and-holding members backward and forward between a holding position for holding the supported posture and a holding cancel position for canceling the holding.

According to a fifth aspect of the present invention, the bump inspection apparatus for IC components as defined in the first aspect is provided, wherein the image-pickup camera unit includes a telecentric lens as an optical lens.

According to a sixth aspect of the present invention, the bump inspection apparatus for IC components as defined in the first aspect is provided, wherein the component housing member is a component housing tray for housing a plurality of IC components arranged separately.

According to a seventh aspect of the present invention, the bump inspection apparatus for IC components as defined in the second aspect is provided, wherein in inspection processing for the formation positions of the respective bumps, the inspection processing portion is operable to detect an outline of the bump in the first bump inspection image or the second bump inspection image and determine a center position of the outline so as to detect the center position as the formation position of the bump, the inspection processing portion comprises a step function edge detection template having an almost circular matching line portion to be matched with the outline of the bump, and a plurality of line-portion moving-and-changing bars, the bars being set along a normal direction of the matching line portion on dividing positions at which the matching line portion is divided at least into approximate quarters, for moving and changing parts of the matching line portion at set-on positions and their vicinities separately in the normal direction so as to separately change partial curvatures in the matching line portion, and on the respective bump images, the inspection processing portion disposes the matching line portion so as to match a part of the matching line portion with a part of the outline of the bump, partially moves and changes the matching line portion in the normal direction with use of at least one or more line-portion moving-and-changing bars while securing a matched position, so that a circular arc portion other than the part of the outline is almost matched with the matching line portion, whereby the template is matched with the outline of the bump and a center position of the matched template is calculated.

According to an eighth aspect of the present invention, the bump inspection apparatus for IC components as defined in the second aspect is provided, wherein in inspection processing for the degrees of crush of the vertex portions of the respective bumps, the inspection processing portion calculates an area of an image region formed by reflection of the light radiated from the unidirectional-light irradiating unit in the outline of the bump in the first bump detection image so as to recognize the calculated area as an area of a crushed plane of the vertex portion, and determines whether or not the area is within a reference area value, whereby inspection processing for the degree of crush of the vertex portion is performed.

According to a ninth aspect of the present invention, the bump inspection apparatus for IC components as defined in the first aspect is provided, wherein the inspection processing portion has an approximately annular inspection region disposed adjacent to an outer periphery of the outline of each of the bumps, and determines whether or not a part of an image of the bump is present in the inspection region, whereby an inspection processing for determining whether or not the bump has an abnormal shape is performed.

According to a tenth aspect of the present invention, the bump inspection apparatus for IC components as defined in the second aspect is provided, wherein the respective bumps have an approximately conical shape or an approximately conical shape having a crushed plane formed on its vertex portion, the unidirectional light radiated from the unidirectional-light irradiating unit is vertex-portion-irradiating light which irradiates the vertex portions of the respective bumps, and the inclined-directional light radiated from the inclined-directional-light irradiating unit is lateral-surface-irradiating light which irradiates lateral faces of the respective bumps.

According to an eleventh aspect of the present invention, a bump inspection method for IC components is provided, comprising:

acquiring an overall image of a bump-formation surface of the IC component having a plurality of bumps formed thereon;

recognizing a position of the IC component on a basis of the acquired overall image;

setting inspection regions of the respective bumps by positioning the inspection regions on the overall image on a basis of a recognition result and acquiring bump inspection images of the respective bumps from the overall image; and performing inspection for formation positions of the respective bumps and inspection for degrees of crush of vertex portions of the respective bumps on a basis of the respective bump inspection images.

According to a twelfth aspect of the present invention, the bump inspection method for IC components as defined in the eleventh aspect is provided, wherein acquisition of the overall image of the IC component is performed by acquiring a first overall image of the IC component due to radiating unidirectional light onto the bump-formation surface along a direction almost orthogonal to the bump-formation surface of the IC component and by acquiring a second overall image of the IC component due to radiating light coming in a plurality of directions from a surrounding of the bump-formation surface toward an almost center of the bump-formation surface, the respective directions being inclined to the bump-formation surface, recognition of the position of the IC component is performed on a basis of the acquired first overall image or second overall image, acquisition of the respective bump inspection images is performed by acquiring first bump inspection images of the respective bumps from the first overall image and by acquiring second bump inspection images from the second overall image, and inspection of the formation positions of the respective bumps is performed on a basis of the respective first bump inspection images or second bump inspection images, and inspection for the degrees of crush of the vertex portions of the respective bumps is performed on a basis of the respective first bump inspection images.

According to a thirteenth aspect of the present invention, the bump inspection method for IC components as defined in the twelfth aspect is provided, wherein inspection of the formation positions of the respective bumps is performed on a basis of the respective second bump inspection images.

According to a fourteenth aspect of the present invention, the bump inspection method for IC components as defined in the eleventh aspect is provided, wherein the IC component is one component selected from a plurality of IC components housed in a component housing tray disposed in an array with the respective bump-formation surfaces facing up, and the overall image of the respective IC components is acquired in the state wherein the IC components are housed and disposed in the component housing tray.

According to a fifteenth aspect of the present invention, the bump inspection method for IC components as defined in the twelfth aspect is provided, wherein inspection of the formation positions of the respective bumps is performed by detecting an outline of each of the bumps and determining a center position of the outline so as to detect the center position as the formation position of the bump, and detection of the outline of the bump is performed with use of a step function edge detection template having an almost circular matching line portion to be matched with the outline of the bump, and a plurality of line-portion moving-and-changing bars, set along normal direction of the matching line portion on dividing positions at which the matching line portion is divided at least into approximate quarters, for moving and changing parts of the matching line portion at the set-on positions and their vicinities separately in the normal direction so as to separately change partial curvatures in the matching line portion, wherein the outline of the bump is detected by:

disposing a part of the matching line portion so as to be matched with a part of the outline of the bump on the first bump inspection image or the second bump inspection image;

partially moving and changing the matching line portion in the normal direction with use of at least one or more line-portion moving-and-changing bars while securing a matched position, and consequently making a circular arc portion other than the part of the outline almost match with the matching line portion, and then matching the template with the outline of the bump.

According to a sixteenth aspect of the present invention, the bump inspection method for IC components as defined in the twelfth aspect is provided, wherein inspection for the degrees of crush of the vertex portions of the respective bumps is performed by:

calculating an area of an image region formed by reflection of the unidirectional light in the outline of the bump in the first bump detection image;

determining whether or not the calculated area as an area of a crushed plane of the vertex portion is within a reference area value; and detecting an anomaly in the degree of crush if the calculated area is beyond the reference area value.

According to a seventeenth aspect of the present invention, the bump inspection method for IC components as defined in the twelfth aspect is provided, further comprising:

disposing an approximately annular inspection region adjacent to an outer periphery of an outline of the bump in each of the first bump inspection images or second bump inspection images of the respective bumps;

determining whether or not a part of an image of the bump is present in the inspection region; and determining if the bump has an abnormal shape if it is determined the image is present.

According to an eighteenth aspect of the present invention, a bump formation method for IC components is provided, comprising:

feeding back inspection results of the respective bumps in the IC component inspected by the bump inspection method for the IC component as defined in the eleventh aspect to a bump formation process for the respective bumps on the IC component; and in the bump formation process, forming the respective bumps on the respective IC components while reflecting the inspection results.

According to a nineteenth aspect of the present invention, an IC component mounting method is provided, comprising:

feeding forward inspection results of the respective bumps in the IC component inspected by the bump inspection method for the IC component as defined in the eleventh aspect to a component mounting process for mounting the IC components on boards; and in the component mounting process, mounting the respective inspected IC components on the boards while reflecting the inspection results.

According to the present invention, in the bump inspection apparatus, instead of separately aligning respective bumps included in a IC component and an image-pickup device in the state wherein each IC component is retained and separately picking up images of respective bumps as in a conventional image acquisition method for bump inspection, the respective bumps are inspected by picking up an overall image of the bump-formation surface of IC components in the state of being housed in the component housing member, and extracting bump inspection images of the respective bumps from the picked up overall image, and this makes it possible to reduce an influence of displacement associated with relative alignment between an image-pickup system and an image-pickup target in each bump inspection image exerted over inspection precision.

Particularly, in the case where alignment between the respective bumps and an image-pickup camera is separately performed as in the conventional inspection method, there is variation in alignment precision per bump, whereas in the present invention where images of the respective bumps formed on one IC component are collectively picked up as an overall image of the bump-formation surface, such a problem can be prevented from occurring.

Further, by picking up the overall image of the IC components and setting inspection regions of the respective bumps in the state of being positioned on the overall image, the bump inspection images of the respective bumps can be acquired from the overall image, which makes it possible to eliminate the operation of separately aligning the image-pickup camera and each bump as in the conventional example and to reduce a time necessary for acquiring images of the respective bumps. Therefore, more efficient inspection becomes possible.

Moreover, such image pickup of the overall image of the IC components can be performed in the state wherein the IC components are housed in the component housing member, which makes it possible to prevent damage to the IC components themselves or to the bumps caused by the IC components being grasped, or by other reasons.

Moreover, in the relative alignment between the image-pickup system and image-pickup target, if alignment between the optical axis of the image-pickup camera unit and the approximate center position on the bump-formation surface of the IC component, which is the image-pickup target, by the image-pickup optical-axis positioning unit is produced by, for example, moving the image-pickup camera unit in directions approximately along the surface of the bump-formation surface, then the component housing member can constantly keep the stationary state. Therefore, it becomes possible to prevent the respective IC components housed in the component housing member from jumping out due to the alignment operation. It is to be noted that in the case where the IC components are unlikely to jump out from the component housing member, it is possible to stop the image-pickup camera unit and move the IC components so as to produce the relative alignment.

Moreover, the lighting device has a unidirectional-light irradiating unit for radiating unidirectional light and an inclined-directional-light radiating unit for irradiating inclined-directional light, and bump inspection is performed by separately using a first bump inspection image picked up by the unidirectional light and a second bump inspection image picked up by the inclined-directional light so as to achieve inspection with higher precision and higher efficiency.

More specifically, by utilizing the characteristic that in the case of the first bump inspection image an image region of the crushed plane on the vertex portion of the bump is displayed with a higher contrast than its surrounding, the degree of crush of the vertex portion of the bump is inspected with use of the first bump inspection image, which makes it possible to achieve inspection with higher precision and higher efficiency.

Such structure and the corresponding operations can be implemented in the bump inspection apparatus, by which inspection with higher precision and higher efficiency can be achieved.

Moreover, the housing-member holding device for holding the housing member can correct warp and distortion of the housing member and hold the housing member while keeping it in an almost horizontal state, so that a distance dimension between the image-pickup camera unit and the IC component, i.e., its image-pickup target, can be kept almost constant. Thus, with the distance being able to be kept almost constant, high-precision inspection can be achieved.

Further, a telecentric lens is adapted as the optical lens included in the image-pickup camera unit, which makes it possible to further reduce an influence of variation in the distance between the camera and the image-pickup target in image pickup operations conducted on picked up images, thereby making it possible to achieve high-precision inspection.

Moreover, with use of a step function edge detection template having a matching line portion and a plurality of line-portion moving-and-changing bars in the inspection of the respective bump-formation positions, it becomes possible to reliably match the matching line portion with the outline of not only a bump having an almost circular outline but also a bump having an oval or flat circular outline by using the respective line-portion moving-and-changing bars to change the matching line portion, and to thereby detect its center position as the formation position of the bump. Therefore, even in the case of bumps having flat circular outlines or other outlines which are determined as inspection error or shape anomaly in the conventional technique, their formation positions can be reliably detected and high-precision inspection can be achieved.

Moreover in the first bump inspection image, an area of an image region formed by reflection of unidirectional light in the outline of the bump is calculated, so that the calculated area can be recognized as an area of the crushed plane on the vertex portion. Further, by determining whether or not the area is within a reference area value, the degree of crush of the vertex portion can be specifically inspected.

Moreover, the bump inspection portion has an approximately annular inspection region disposed adjacent to an outer periphery of the outline of each bump and determines whether or not a part of the image of the bump is present in the inspection region, so that it can be determined whether the bump has a shape anomaly.

Moreover, the inspection results of the bumps in the respective aspects are fed back to a formation step of bumps on the IC component, and in the bump formation process, the respective bumps are formed on a new IC component with the inspection results being reflected, so that efficient bump formation can be performed with effective utilization of the inspection results. Particularly, in consideration of the fact that such IC components are relatively expensive components, prevention of faulty components from being generated becomes more effective.

Moreover, the inspection results of the bumps in the different aspects are fed, forward to a mounting step of the IC components on boards, and in the mounting step, the inspected IC components are mounted on the boards with the inspection results reflected, so that the mounting of IC components with higher precision can be achieved. For example, based on information on the displacement amount of the formation positions of the respective bumps, the IC components are mounted so as to correct the displacement amount, so that mounting with higher precision can be achieved.

BRIEF DESCRIPTION OF THE DRAWINGS

These and other aspects and features of the present invention will become clear from the following description taken in conjunction with the preferred embodiments thereof with reference to the accompanying drawings, in which:

FIG. 4A is a schematic explanatory view for explaining an image pickup method using two kinds of lighting units in the first embodiment, showing the state of acquiring an image of a bump which has a sharp vertex portion by using a coaxial lighting unit;

FIG. 4B is a schematic explanatory view for explaining the image pickup method using two kinds of lighting units in the first embodiment, showing the state of acquiring an image of the bump in the above state by using a dome lighting unit;

FIG. 6 is a control block diagram for showing the control structure in the bump inspection apparatus in the first embodiment;

FIG. 18A is a view for showing an inspection method for the presence of shape anomaly of bumps in the first embodiment and is a view for showing the state in which an outline of the bump is detected;

FIG. 18B is a view for showing an inspection method for the presence of a shape anomaly of bumps in the first embodiment and is a view for showing the state in which an annular inspection region is set in the surrounding of the outline and an abnormal shape is detected;

DETAILED DESCRIPTION OF THE PREFERRED EMBODIMENTS

Figure 1:
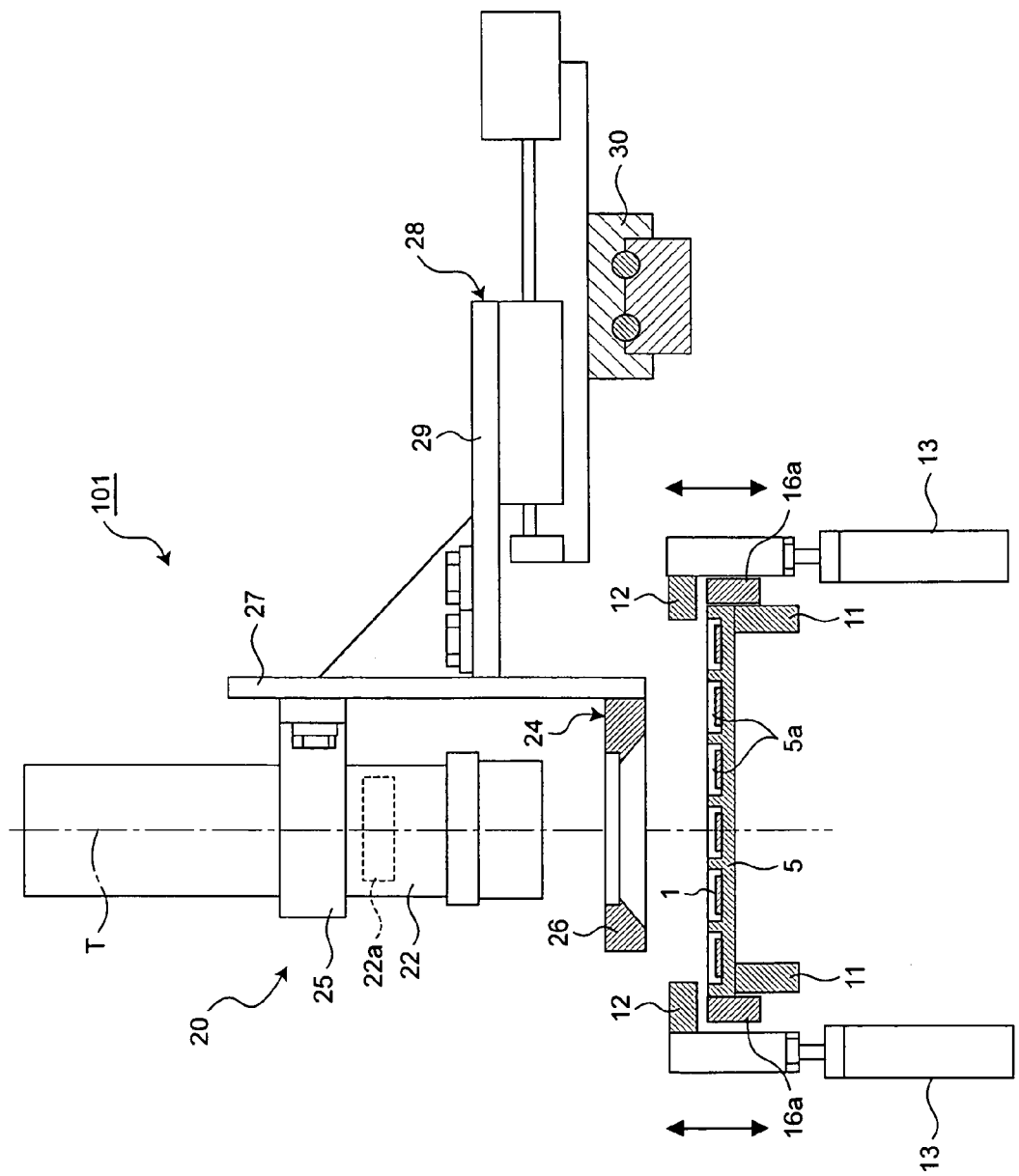
FIG. 1 is a schematic structural view for showing the structure of a bump inspection apparatus according to a first embodiment of the present invention and is a cross sectional view taken along line A-A in FIG. 2.

Before the description of the present invention proceeds, it is to be noted that like parts are designated by like reference numerals throughout the accompanying drawings.

Hereinbelow, one embodiment of the present invention is described in detail with reference to the accompanying drawings.

First Embodiment

Figure 2:
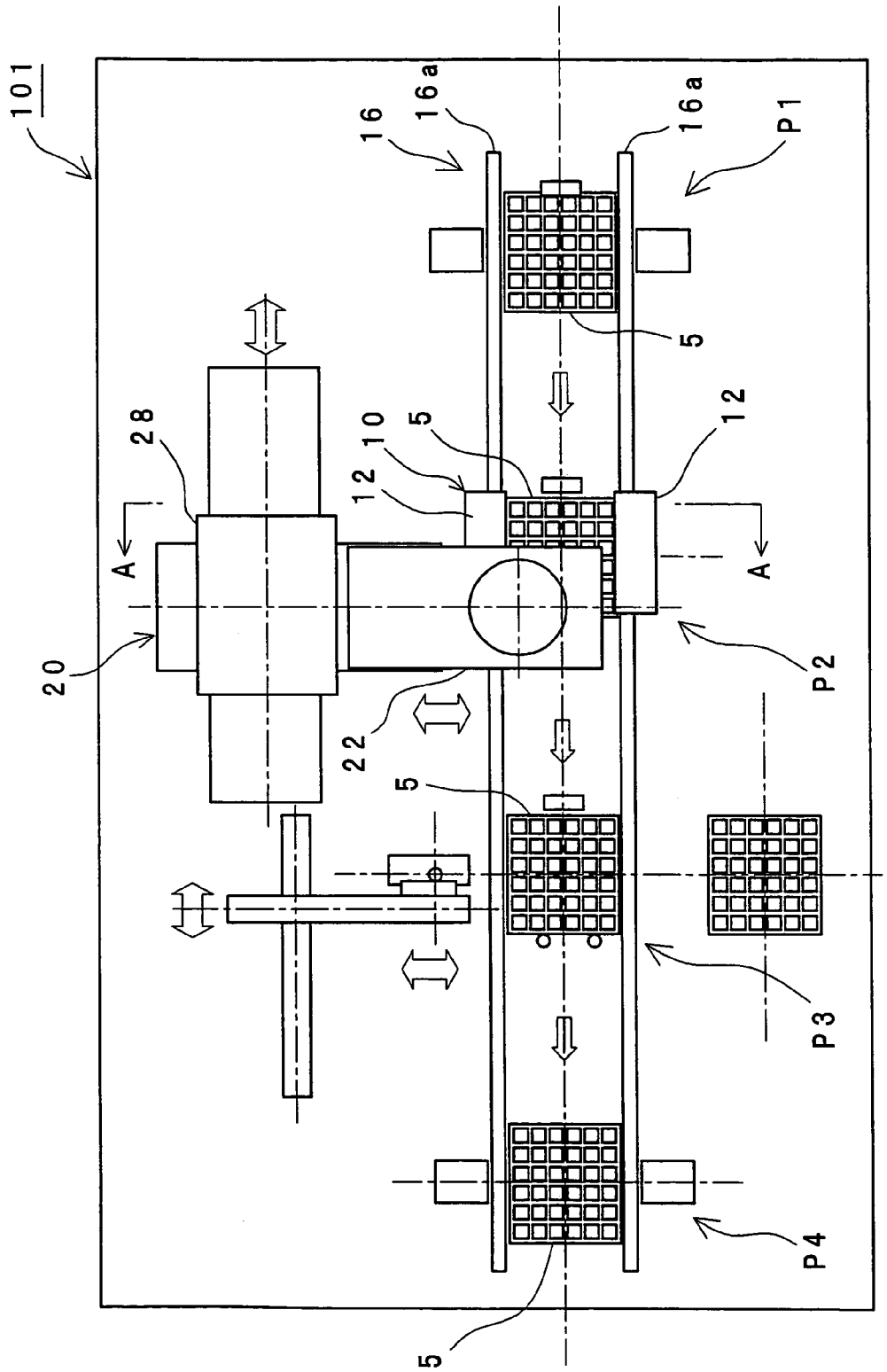
FIG. 2 is a schematic plane view for showing the bump inspection apparatus in the first embodiment.

FIG. 1 is a schematic structure view for showing a schematic structure of a bump inspection apparatus 101 as an example of a bump inspection apparatus for IC components according to the first embodiment of the present invention, and further, FIG. 2 is a schematic plane view for showing a plane structure thereof. It is to be noted that the schematic structure view of the bump inspection apparatus 101 shown in FIG. 1 is a schematic cross sectional view taken along line A-A in the schematic plane view of FIG. 2.

As shown in FIG. 1, the bump inspection apparatus 101 acquires images of a plurality of bumps formed on a plurality of electrode pads included in an IC component that is a semiconductor bare chip, and performs recognition processing of the acquired images to detect formation states of the respective bumps.

Figure 3:
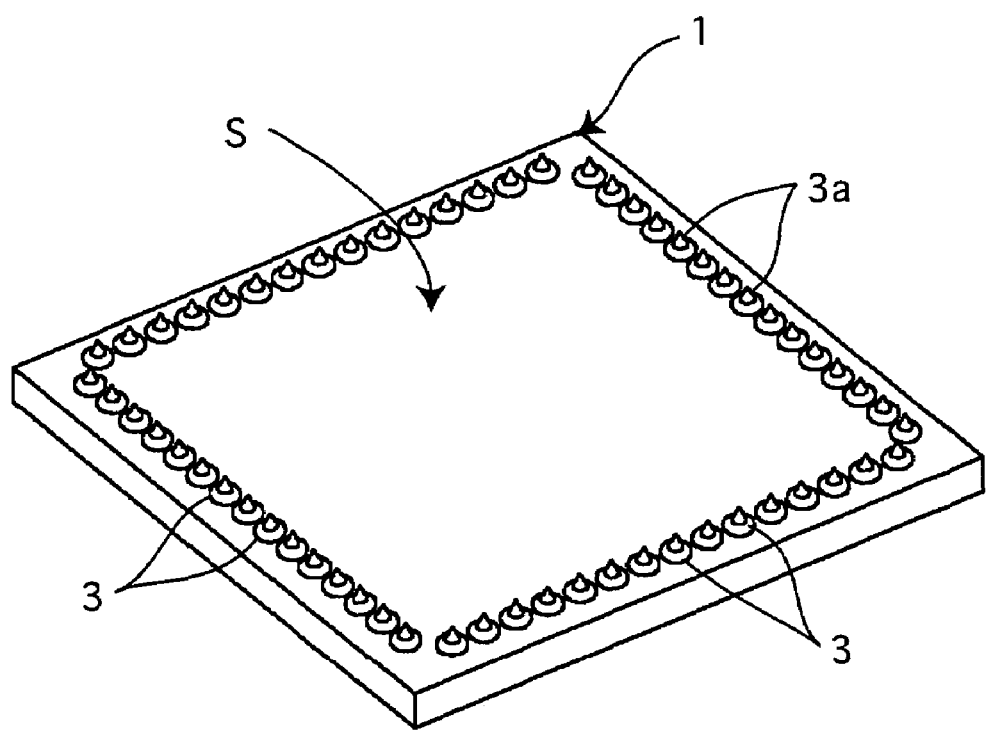
FIG. 3 is a schematic perspective view for showing an IC component handled in the first embodiment.

Herein, FIG. 3 shows a schematic outer perspective view for showing such an IC component 1. As shown in FIG. 3, the IC component 1 is disposed with a bump-formation surface S which is the surface with respective bumps 3 formed thereon facing up. Moreover, the IC component 1, for example, in an almost square shape, and a number of bumps 3 are formed arranged in an array at specified interval pitch in the vicinity of a peripheral edge portion on the bump-formation surface S. Moreover, the respective bumps 3 have an approximately conical shape and have a vertex portion 3a that is a top portion formed into a protruding shape. For example, direct or indirect connection between the vertex portion 3a and a board electrode of a board allows mounting of the IC component 1 onto the board. It is to be noted that in the IC component 1 in FIG. 3, the respective electrode pads formed on the bump-formation surface S are omitted. Although description is given of the case where the IC component 1 is in an almost square shape in the first embodiment, the IC component 1 is not limited to those formed in an almost square shape, and may be formed in various shapes, including a rectangular shape.

Moreover, such respective bumps 3 are formed by, for example, a stud-bump method. More specifically, for example, an Au ball formed by discharge-melting of the top of an Au wire is metal-joined to an Al pad surface on the IC component 1 by heat and ultrasonic waves, and the top is finally cut off before leveling processing is performed where necessary for forming respective bumps 3. It is to be noted that in such a stud-bump method, an Au ball is formed, pressed to the A1 pad and then is cut off, which brings about the characteristic that the respective bumps 3 cannot take a smooth spherical shape in the method.

Moreover, as shown in FIG. 1 and FIG. 2, such an IC component 1 is handled in the state that a plurality of the IC components 1 are housed in a component tray 5 as an example of the component housing member having a plurality of component housing portions 5a, which are recessed portions capable of separately housing IC components 1 on their upper surfaces, arranged in an array. In consideration of housing operability of the IC components 1 in the component housing portions 5a and extraction operability of the IC components 1 from the component housing portions 5a, the inner size of the respective component housing portions 5a is set to be larger than the outer size of the IC component 1. Consequently, while the movement range of the IC components 1 housed in the component housing portions 5a is limited to a specified range, the arrangement thereof is not fully secured. It is to be noted that in the respective component housing portions 5a, the respective IC components 1 are housed with the bump-formation surface S as the upper surface side.

As shown in FIG. 1 and FIG. 2, the bump inspection apparatus 101 includes a tray holding device 10 as an example of the housing-member holding device for holding the component tray 5 in the state of housing a plurality of the IC components 1 and an image-pickup device 20 for picking up images of the respective IC components 1 housed in the component tray 5 which is held by the tray holding device 10. Moreover, the image-pickup device 20 includes a camera unit 22 as an example of the image-pickup camera unit for acquiring images by the image pickup operation, a lighting device 24 for irradiating light onto the bump-formation surface S of the IC component 1 that is a image-pickup target for the image pickup operation, and an image-pickup movement device 28 as an example of the image-pickup optical-axis positioning unit for aligning an image pickup optical axis T included in the camera unit 22 and an approximate center of the IC component 1 that is the image-pickup target for image pickup operation by moving the camera unit 22 in directions approximately along the surface of the bump-formation surface S of the IC component 1. Further, as shown in FIG. 2, the bump inspection apparatus 101 has a tray transportation device 16 for transporting the component tray 5 fed from a tray feeding position P1 disposed in the vicinity of the right-side end portion of the apparatus as viewed in the drawing, to an inspection position P2 disposed on the left side, as viewed in the drawing, a faulty component discharge position P3, and a tray discharge position P4 disposed in the vicinity of the left-side end portion of the apparatus in such a way as to allow the component tray 5 to be positioned in the respective positions while supporting the component tray 5 on both the end portions by two rails 16a.

As shown in FIG. 1 and FIG. 2, the tray holding device 10 has a function to reliably secure the component tray 5 in the inspection position P2 in the state in which the end portions opposed to each other are retained by the respective rails 16a of the tray transportation device 16, with the retention position being cancelable. More specifically, the tray holding device 10 has lower-side support members 11 capable of supporting the end portions of the component tray 5 opposed to each other from their lower surface side so as to keep it in an almost horizontal state, and upper-side support members 12 for pressing down the end portions opposed to each other in the component tray 5, which is in the state of being supported by the respective lower-side support members 11, lower than their upper surface side so as to apply biasing force to the respective end portions toward the lower-side support members 11 and to keep the support position by the respective lower-side support members 11. Further, the tray holding device 10 has a support member elevating device 13 for integrally driving the respective upper-side support members 12 up and down.

With the tray holding device 10 having such structure, while the component tray 5 transported to the inspection position P2 by the tray transportation device 16 is supported by the respective lower-side support members 11, the respective upper-side support members 12 in the state of being positioned in their elevated position are integrally lowered by the support member elevating device 13 and the respective end portions of the component tray 5 are pressed to the respective lower-side support members 11, by which the support position can be maintained. Moreover, such a component tray 5 is often formed from resin and the like, and is sometimes has some warp (e.g., a warp of approx. 0.3 mm). Even in such a case, the respective lower-side support members 11 retain the component tray 5 to be kept almost horizontal, which allows correction of the warp, thereby allowing the component tray 5 in a retained state to be kept almost horizontal.

Moreover, as shown in FIG. 1, an optical axis T for image pickup in the camera unit 22 is disposed so as to be approximately orthogonal to the bump-formation surface S of the IC component 1, and the camera unit 22 has a telecentric lens 22a as an image pickup optical lens disposed on the optical axis T. In an optical system structured for use of such a telecentric lens 22a, an aperture diaphragm can be positioned in a focus position of the lens, so that a primary optical axis can be made parallel to the optical axis of the lens on an object side or on both sides. In the optical system in particular, in the case of adopting the structure in which a telecentric lens is disposed on the object side, an angle of view (telecentricity) can be made arbitrarily approximate to 0 degrees, so that size fluctuation or position fluctuation can be decreased even if an object, i.e., a shooting object, moves up and down, which makes it possible to reduce the error of measurement. Therefore, even in the case where there is variation in distances from the camera unit 22 to the bump-formation surface S of the IC component 1 that is an image-pickup target because of a warp of the component tray 5, or other reasons, in the bump inspection apparatus 101, it becomes possible to prevent variation in the apparent size of respective IC components 1 caused by variation in the distance from occurring in picked up images.

Moreover, as shown in FIG. 1, the lighting device 24 includes a coaxial lighting unit 25 as an example of the unidirectional-light irradiating unit for radiating unidirectional light onto the bump-formation surface S of the IC component 1, which is to be the image-pickup target, in a direction along the optical axis T, and a dome lighting unit 26 as an example of the inclined-directional-light irradiating unit for radiating light to the bump-formation surface S, the light coming in a plurality of directions from the surroundings of the bump-formation surface S toward the approximate center of the bump-formation surface S, the respective directions being inclined to the bump-formation surface S.

The coaxial lighting unit 25 is disposed in the vicinity of the camera unit 22, and a structure in which, for example, with use of a reflection mirror, light coming from a direction orthogonal to the optical axis T is reflected by the reflection mirror toward the direction along the optical axis T is adopted. Further, since such a coaxial lighting unit 25 is adopted together with the telecentric lens, light radiated along a primary light beam and reflected on the surface of the bumps 3 can be captured to pick up images of the respective bump 3, and therefore changes in reflectance on the surface of bumps 3 can be read as contrasts. More particularly, it becomes possible to acquire high-precision images which allow recognition of extrusions or indentions on the surface of the bump 3 or changes of the curved surface thereof.

Moreover, the dome lighting unit 26 irradiates light to the surface of the bump 3 not only in the direction along the optical axis T but also in the directions inclined from the optical axis T at various angles, and with the images picked up by the reflected light, it becomes possible to acquire images free from shadowed portions produced by extrusions or indentions on the surface of the bump 3 or changes of the curved surface thereof. More particularly, the dome lighting unit 26 functions as a shadowless lamp. In order to implement such a function and effect, the dome lighting unit 26 should preferably be capable of radiating the inclined-directional light at least in three directions disposed at almost equal angles around the approximate center of the bump-formation surface S as a plurality of the directions from the surroundings of the bump-formation surface S toward the approximate center thereof.

Moreover, the camera unit 22 has an image-pickup element having relatively large number of pixels, e.g., a CCD (unshown), so that an image of the bump-formation surface S of each IC component 1 housed in the respective component housing portions 5a of the component tray 5 can be collectively picked up per IC component 1.

Moreover, as shown in FIG. 1, the camera unit 22, the coaxial lighting unit 25 and the dome lighting unit 26 are put in an integrated state by a common frame 27 and further are supported integrally through the frame 27 in a movable way by the image-pickup movement device 28. The image-pickup movement device 28 has a Y-axis direction moving device 29 for moving the frame 27 along the direction (referred to as the Y-axis direction) almost orthogonal to a transportation direction of the component tray 5, and an X-axis direction moving device 30 for supporting the Y-axis direction moving device 29 and moving the Y-axis direction moving device 29 along the transportation direction (referred to as the X-axis direction) of the component tray 5. These respective movement devices can be structured with use of, for example, an LM guide, an LM block engaged with the LM guide and a ball screw shaft mechanism, or the like.

Herein, the characteristics of two kinds of lighting units included in the lighting device 24 in the bump inspection apparatus 101, i.e., the coaxial lighting unit 25 and the dome lighting unit 26, will be described in detail. For the description, FIGS. 4A, 4B and FIGS. 5A, 5B show schematic explanatory views for showing the states of irradiation and reflection of light from the respective lighting units to the bumps.

First, FIG. 4A is a schematic explanatory view for showing the state of irradiating light onto a bump 3 by the coaxial lighting unit 25. The coaxial lighting unit 25 has a reflection mirror 25a, and is capable of reflecting emitted light by the reflection mirror 25a to produce coaxial light W1, that is light along the optical axis T, and irradiating it onto the bump 3 disposed below. Since the bump 3 shown in FIG. 4A has an almost conical shape, the coaxial light W1 irradiated onto the surface of the bump 3 is reflected and diffused by the conical surface, and therefore the irradiated coaxial light W1 will not be reflected along the optical axis T nor come incident to the camera unit 22. Therefore, in the images picked up by such a camera unit 22, the surface of the bump 3 appears black.

Next, FIG. 4B shows a schematic explanatory view for showing the state in which light is radiated to the bump 3 by the dome lighting unit 26. The dome lighting unit 26 can radiate diffused light W2 (an example of the inclined-directional light), that is light inclined at various angles from the optical axis T, onto the bump 3 disposed below. As shown in FIG. 4B, the diffused light W2 radiated onto the surface of the bump 3 by the dome lighting unit 26 is radiated to the entire surrounding of the bump 3, and part of the radiated diffused light W2 is reflected by the almost conical-shaped surface along the optical axis T. Reflected light W3, that is the reflected light, is received by the camera unit 22, so that an image of the bump 3 is picked up. Therefore, in the imaged picked up by such a camera unit 22, the entire surface of the bump 3 appears white.

Figure 5A:
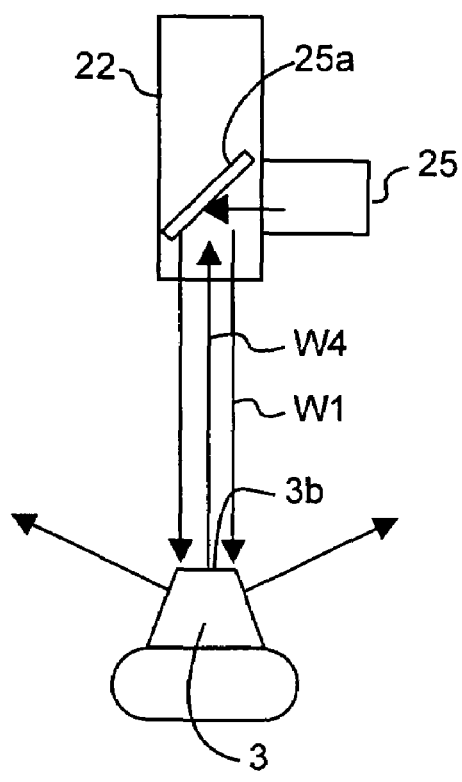
FIG. 5A is a schematic explanatory view for explaining the image pickup method using two kinds of lighting unit in the first embodiment, showing the state of acquiring an image of a bump which has a crushed plane on the vertex portion by using the coaxial lighting unit.

FIG. 5A is a schematic explanatory view for showing the state in which the coaxial light W1 is radiated to the bump 3 by the coaxial lighting unit 25, in which the bump 3 is different in shape from that shown in FIG. 4A with a crushed plane 3b (flat face) being formed on the vertex portion 3a of the bump 3. As shown in FIG. 5A, the coaxial light W1 radiated onto the surface of the bump 3 is reflected and diffused in a lateral surface portion of the bump 3, whereas the coaxial light W1 is reflected along the optical axis T on the crushed plane 3b, which is a plane almost orthogonal to the optical axis T. Reflected light W4 that is a reflection of the light is received by the camera unit 22, so that an image of the bump 3 is picked up. In the images picked up in such a way, the lateral surface of the bump 3 appears black while the crushed plane 3b appears white.

Figure 5B:
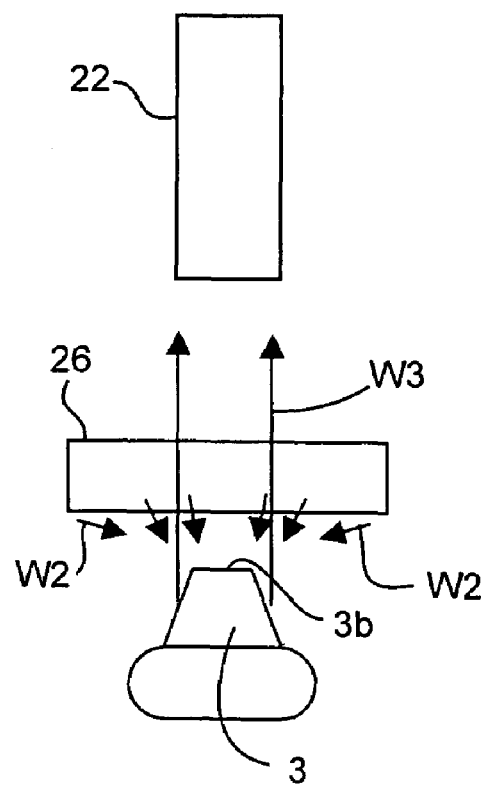
FIG. 5B is a schematic explanatory view for explaining the image pickup method using two kinds of lighting unit in the first embodiment, showing the state of acquiring an image of the bump in the above state by using the dome lighting unit.

Further, FIG. 5B is a schematic explanatory view for showing the state in which the diffused light W2 is radiated by the dome lighting unit 26 to the bump 3 having such a crushed plane 3b. As shown in FIG. 5B, part of the diffused light W2 radiated to the bump 3 by the dome lighting unit 26 is reflected by the entire surface of the bump 3 along the optical axis T. However, since the dome lighting unit 26 is disposed on the optical axis T for image pickup in the camera unit 22, there is a hollow portion on the optical axis T and in the vicinity thereof for the camera unit 22 to obtain the reflected light. The diffused light W2 radiated from the dome lighting unit 26 having such structure has no coaxial-light-component along the optical axis T (or if it has any components, the components are small). Therefore, in the picked up images, the lateral surface portion of the bump 3 appears white, while the crushed plane 3b portion appears blacker than the lateral surface portion.

It is to be noted that the coaxial light W1 radiated to the vertex portion 3a (or the crushed plane 3b formed on the vertex portion 3a) of the bump 3 having such an approximate conical shape can constitute an example of light for vertex portion irradiation, and further the diffused light W2 radiated mainly to the lateral surfaces can constitute an example of light for lateral surface irradiation.

The bump inspection apparatus 101 having such structure has a control device 50 for performing comprehensive control while associating operations of respective component portions and for performing detection processing operation of the formation states of bumps 3 based on picked up images. A control block diagram for showing the structure of the control device 50 is shown in FIG. 6, and the structure of the control device 50 is described with reference to FIG. 6.

As shown in FIG. 6, the control device 50 includes an axis control portion 51 for controlling movement of the image-pickup device 20 by the image-pickup movement device 28, a lighting control portion 52 for controlling radiation of light by the lighting device 24, a holding control portion 53 for controlling holding/holding cancel operation of the component tray 5 by the tray holding device 10, and an inspection control portion 54 for controlling image acquisition by the image-pickup device 20 and image processing of the acquired images so as to inspect the formation states of the bumps.

The axis control portion 51 is capable of controlling movement of the image-pickup device 20 by the X-axis direction moving device 30 and the Y-axis direction moving device 29, i.e., the movement operation of the optical axis T against the component tray 5 held by the tray holding device 10, and is capable of performing movement operation of the image-pickup device 20 so that the optical axis T is positioned in the approximate center of the respective IC components 1 housed in the component tray 5.

The lighting control portion 52 is capable of controlling irradiation of the coaxial light W1 by the coaxial lighting unit 25 included in the lighting device 24 and controlling irradiation of the diffused light W2 by the dome lighting unit 26, which allows selective usage of the coaxial lighting unit 25 and the dome lighting unit 26 according to the types of images desired to be picked up and acquired. Moreover, the timing of light irradiation by the respective lighting portions and the timing of image pickup by the camera unit 22 are controlled so as to be synchronized.

The holding control portion 53 is capable of controlling the holding/holding cancel operation of the component tray 5 by elevation of the upper-side support members 12 by the support member elevating device 13, and performs control operations associated with transportation of the tray transportation device 16 so that when the component tray 5 is held by the tray holding device 10, transportation of the component tray 5 by the tray transportation device 16 is stopped; when the holding is cancelled, the transportation is carried out.

Moreover, as shown in FIG. 6, the inspection control portion 54 includes an image storage portion 61 for readably storing images acquired by the image-pickup device 20, a component position recognition portion 62 for reading an image stored in the image storage portion 61 to recognize the position of the IC component 1 based on the image, a bump inspection region setting portion 63 for setting inspection regions of the respective bumps whose arrangement is preset based on the positions in which the respective bumps 3 should be formed on the IC component 1 (detailed description will be given later) on the image of the IC component 1 based on a recognition result by the component position recognition portion 62 so as to acquire bump inspection images of the respective bumps 3 from the image of the IC component 1, a bump inspection portion 64 as an example of the inspection processing portion for performing inspection processing of the formation positions and the like, of the respective bumps 3 based on the respective bump inspection images, a quality determination portion 65 for determining the quality based on the inspection result, and further an inspection condition setting portion 66 for setting inspection conditions which are standards for determination in the quality determination portion 65. Further, the control device 50 has a display portion 67 for displaying determination results in the quality determination portion 65 in a recognizable way, which enables an operator of the bump inspection apparatus 101 to recognize the inspection results through the display portion 67.

It is to be noted that in the control device 50, information for identifying an IC component 1 which is to be an inspection target, including a component number of the IC component 1, and bump number to identify respective bumps 3 formed on the IC component 1, is inputted and stored, and the component information can be associated with later-described bump inspection result information.

Figure 7:
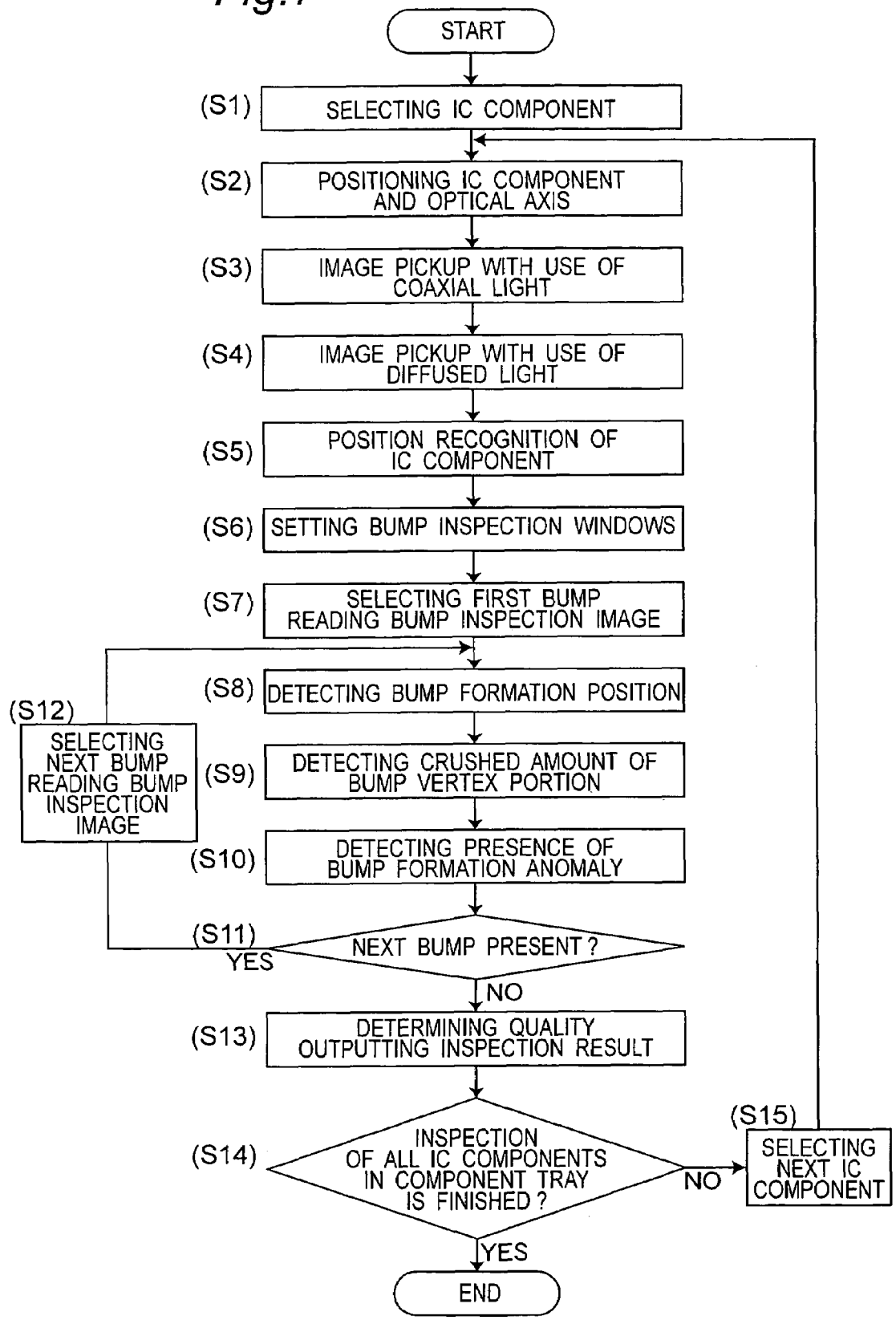
FIG. 7 is a flowchart for showing the procedure of a bump inspection method in the first embodiment.

Description is now given of the procedures for performing the inspection processing of the respective bumps 3 in the IC component 1 in a bump inspection apparatus 101 having the above-described structure. For the description, first, a flowchart of the procedures for the inspection processing is shown in FIG. 7. It is to be noted that the respective procedures in the inspection processing are comprehensively controlled like the respective component portions of the bump inspection apparatus 101 which perform operations associated with each other by the control device 50.

Figure 8A:
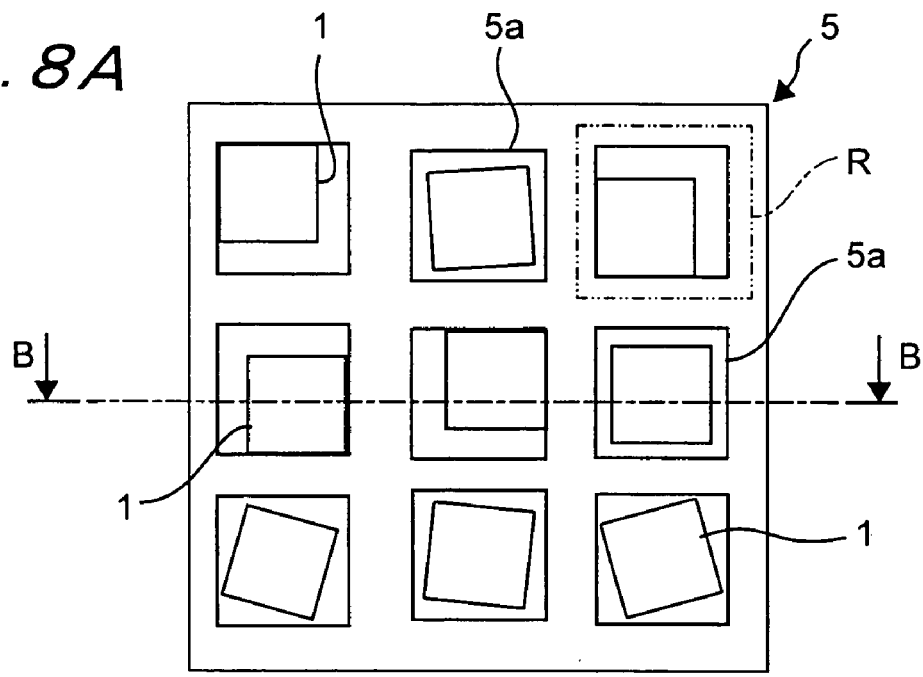
FIG. 8A is a schematic plane view for showing the state of respective IC components being housed in a component tray.
Figure 8B:
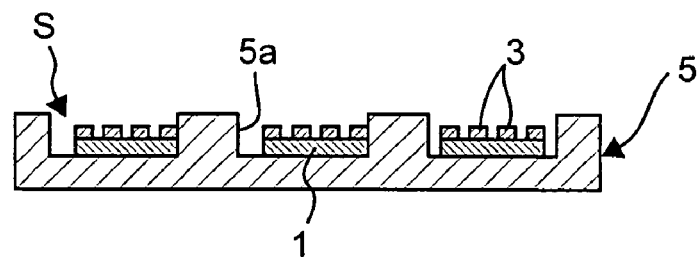
FIG. 8B is a cross sectional view taken along line B-B in FIG. 8A showing the component tray.

First, before the inspection processing is started, a schematic plane view for showing the state that a plurality of the IC components 1 are housed in the component tray 5 is shown in FIG. 8A, and a cross sectional view taken along line B-B in FIG. 8A showing the component tray 5 is shown in FIG. 8B.

As shown in FIG. 8A and FIG. 8B, the component tray 5 has, for example, 9 component housing portions 5a arranged in an array, and in the respective component housing portions 5a, the IC components 1 are separately housed with the bump-formation surface S facing up. Moreover, since the respective component housing portions 5a are formed larger than the outer shape of the IC component 1, the disposition of the IC components 1 housed in the respective component housing portions 5a are unsecured. The following description is given on the assumption that an IC component 1 housed in the component housing portion 5a disposed at the left upper corner as viewed in the drawing in the component tray 5 is the first image-pickup target IC component 1.

First, in FIG. 2, the component tray 5 is fed to a tray feeding position P1 in the tray transportation device 16. The component tray 5 is transported by the tray transportation device 16 from the tray feeding position P1 to the inspection position P2, where the component tray 5 is held by the tray holding device 10.

Then, in step S1 in FIG. 7, an IC component 1 (IC component 1 housed in the right upper corner as viewed in FIG. 8A) which is inspected first is selected among IC components 1 housed in the component tray 5. Once a selection is made, the movement of the image-pickup device 20 is performed by the image-pickup movement device 28 in step S2, and the optical axis T is positioned in the approximate center of the selected IC component 1. Moreover, in such a positioned state, an image of the IC component 1 is picked up by the camera unit 22. An image-pickup field of view R by the camera unit 22 is set as shown in FIG. 8A so that the entire component housing portion 5a housing the IC component 1 is included. With the image-pickup field of view R being set in such a range, an image of the IC component 1 can be reliably acquired even when the disposition of the IC component 1 in the component housing portion 5a is not secured.

Next, in step S3, the coaxial light W1 is radiated by the coaxial lighting unit 25 onto the bump-formation surface S of the IC component 1 and an overall image (referred to as a first overall image) of the IC component 1 formed by the reflected light W4 is picked up. The first overall image acquired by the image pickup is stored in the image storage portion 61 in the inspection control portion 54. It is to be noted that once image acquisition by the image pickup is completed, light radiation by the coaxial lighting unit 25 is stopped.

Then, in step S4, the diffused light W2 is radiated by the dome lighting unit 26 onto the bump-formation surface S of the IC component 1, and an overall image (referred to as a second overall image) of the IC component 1 formed by the reflected light W3 is picked up. The second overall image acquired by the image pickup is stored in the image storage portion 61 in the inspection control portion 54. It is to be noted that once image acquisition by the image pickup is completed, light irradiation by the dome lighting unit 26 is stopped.

Figure 9:
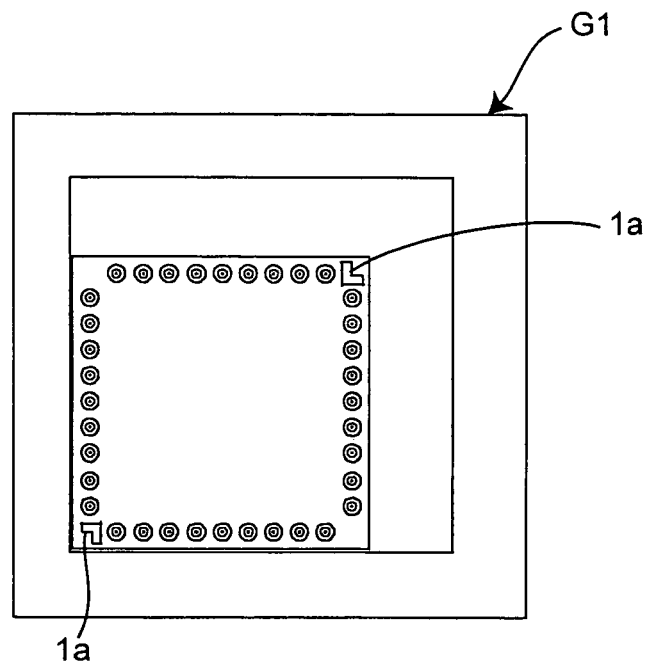
FIG. 9 is a schematic view for showing an overall image of the IC components in the state of being housed in the component housing member.
Figure 10:
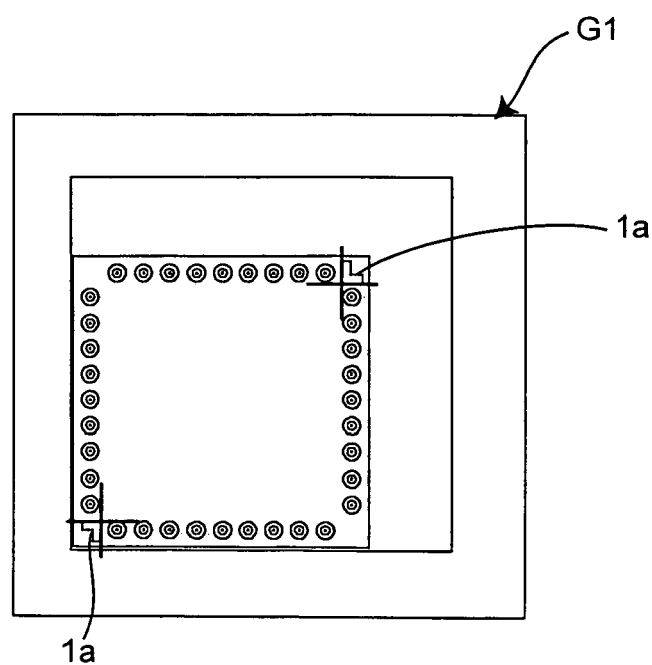
FIG. 10 is a schematic view for showing the state in which position recognition is performed on the overall image of the IC components in FIG. 9.

Once the images are acquired, position recognition of the IC component 1 is performed based on the acquired images in step S5. More specifically, for example, the first overall image which is an image picked up with use of the coaxial light W1 is read from the image storage portion 61 and the position recognition is performed in the component position recognition portion 62. In the first image G1 of the IC component 1, as shown in a schematic plane view in FIG. 9 for example, images of respective bumps 3, the IC component 1 and the component housing portion 5a in the state that IC component 1 is housed in the component housing portion 5a are collectively acquired. Moreover, as shown in FIG. 9, at the right upper corner and the left lower corner as viewed in the drawing on the bump-formation surface S of the IC component 1, reference marks 1a for position recognition are formed. It is to be noted that disposition of the respective reference marks 1a on the bump-formation surface S of the IC component 1 is not limited to this configuration and other various configurations are possible. As shown in FIG. 10, in the component position recognition portion 62, by recognizing such respective reference marks 1a, a housing posture of the IC component 1 in the component housing portion 5a in the first overall image, i.e., planar position and angle, is acquired.

Figure 11:
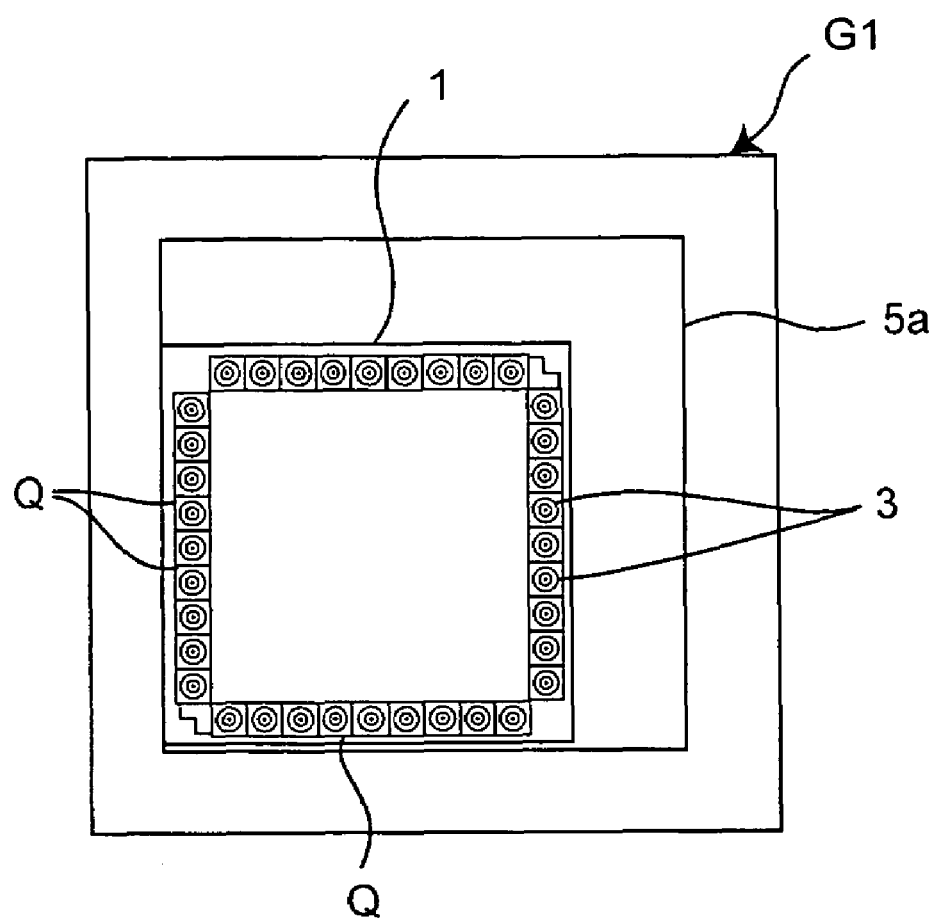
FIG. 11 is a schematic view for showing the state in which a bump inspection window is set on the overall image of the IC components in FIG. 9.

Then, in step S6, based on the position information on the IC component 1 in the first overall image G1 recognized in the component position recognition portion 62, bump inspection windows Q are set as bump inspection regions for the respective bump 3 preset on the first overall image G1. The bump inspection windows Q herein refer to regions (windows) which are for cutting out images of the respective bumps 3 formed on the IC component 1 from the first overall image G1 of the IC component 1 as shown in FIG. 11, and which are preset on the basis of the respective reference marks 1a and the formation positions of the respective bumps 3 in design. Moreover, such inspection windows Q are set to have a size large enough for the images of the respective bumps 3 to be housed within their region range. Moreover, as described before, the disposition of the IC component 1 is not secured in the component housing portion 5a, and so setting of the bump inspection windows Q are made by positioning and arranging the bump inspection windows Q in the picked up first overall image G1 based on the result of the position recognition of the IC component 1. With such setting of the bump inspection windows Q, first bump inspection images G3 about individual bumps 3 are acquired from the first overall image G1.

Such a setting operation of the bump inspection windows Q also applies to the second overall image G2 that is an image of the IC component 1 picked up with the diffused light W2. For example, the bump inspection windows Q are arranged and set on the second overall image G2 with use of the result of a position recognition of the IC component 1, by which second bump inspection images G4 about individual bumps 3 are acquired from the second overall image G2. It is to be noted that thus-acquired respective first bump inspection images G3 and second bump inspection images G4 are stored, for example, in the image storage portion 61.

Next, in step S7, a bump 3 which is to be inspected first is selected out of the first bump inspection images G3 stored in the image storage portion 61, and the first bump inspection image G3 of the selected bump 3 is read out. Then, in step S8, the formation position of the bump is detected in the bump inspection portion 64. The detection of the bump-formation position is performed by recognizing an outline of the bump 3 (e.g., almost circular outline) from the first bump inspection image G3 through pattern matching, and then by calculating a center position of the outline. It is to be noted that the recognition result is outputted to the quality determination portion 65.

Moreover, the detection processing of the bump-formation position in step S8 is not limited to the case using the first bump inspection image G3 but may include the case using the second bump inspection image G4. While the outline of the bump 3 may be recognized both in the first bump inspection image G3 picked up with the coaxial light W1 and in the second bump inspection image G4 picked up with the diffused light W2, the inspection processing of the bump-formation position should preferably be performed with use of the second bump inspection image G4 with the diffused light W2 which allows only an image of the bump 3 to be picked up with a high contrast as described later.

Next, in step S9, with use of the acquired first bump inspection image G3, the degree of crush of the vertex portion 3a of the bump 3 is inspected in the bump inspection portion 64. In the inspection of the degree of crush, the first bump inspection image G3 picked up with the coaxial light W1 is used and when a crushed plane 3b is present on the vertex portion 3a of the bump 3 in the image G3, the crushed portion appears white. By utilizing this phenomenon, an area appearing white is calculated so as to calculate the size of the crushed plane 3b. It is to be noted that when the second bump inspection image G4 picked up with the diffused light W2 is used, a portion of the crushed plane 3b on the vertex portion 3a appears blacker than its surrounding (portion appearing white), which makes it possible to use the second bump inspection image G4 in the inspection of the degree of crush. However, since a contrast between the crushed plane 3b and its surrounding portion is more prominent in the first bump inspection image G3 than in the second bump inspection image G4, it is preferable to use the first bump inspection image G3 in the inspection of the degree of crush. It is to be noted that the inspection result is outputted to the quality determination portion 65.

Next, in step S10, with use of the first bump inspection image G3 or the second bump inspection image G4, inspection is performed to determine whether or not an almost protruding (or almost conical shape) shape of the bump 3 has any anomaly. More specifically, as described in detail later, inspection is performed to determine the presence of abnormal shapes produced in the case where the vertex portion 3a of the bump 3 is formed considerably away from the almost center area of the bump 3 in a planar view point or in the case where a part of the lateral surface of the bump 3 is formed protruding outward from its planar outline. It is to be noted that the inspection result is outputted to the quality determination portion 65.

Once the respective inspections are performed on the first selected bump 3, it is determined whether or not another bump 3 to be inspected next is present on the IC component 1 in step S11, and if it is determined that another bump 3 is present, then the next bump 3 is selected in step S12, and a first bump inspection image G3 and a second bump inspection image G4 of the next bump 3 selected by the bump inspection portion 64 are read out from the image storage portion 61. After that, in the bump inspection portion 64, the respective inspections from the step S8 to the step S10 are carried out.

In step S11, if it is determined that another bump 3 to be inspected next is not present on the IC component 1, then the quality determination of the respective bumps 3 is performed in the quality determination portion 65 based on the inspection conditions preset in the inspection condition setting portion 66. It is to be noted that the quality determination by the quality determination portion 65 may be replaced with the determination in the bump inspection portion 64. Moreover, the result of the quality determination, i.e., the inspection result, is outputted to the display portion 67 from the quality determination portion 65 (step S13).

Then, in step S14, it is determined whether or not the inspection of all the IC components 1 housed in the component tray 5 is finished, and if the inspection is not yet finished, then a next IC component 1 is selected in step S15, and the respective processing from step S2 to step S13 are performed on the selected IC component 1. If it is determined that the inspection of all the IC components 1 is finished in step S14, then the inspection processing is completed. It is to be noted that instead of picking up an image of the next IC component 1 after inspection processing of one IC component 1 is completed, the image pickup operation of the next IC component 1 may be performed continuously after the image pickup operation of the one IC component 1 is performed, and simultaneously with the image pickup operation, bump inspection processing using an image of the first IC component 1 may be performed.

Once the inspection processing is completed, holding of the component tray 5 by the tray holding device 10 is cancelled, and then the component tray 5 is transported by the tray transportation device 16 from the inspection position P2 to the faulty component discharge position P3. In the faulty component discharge position P3, an IC component 1 determined to have a failure in the formation state of any bump 3 based on the result of the inspection processing is taken out of the component tray 5 and discharged. After that, the component tray 5 is discharged to the tray discharge position P4 by the tray transportation device 16, and the component tray 5 is discharged out of the bump inspection apparatus 101.

Although in the description of the preceding steps, a description has been given of the case where the first overall image is picked up in step S3 and then the second overall image is picked up in step S4, instead of such a case, the first overall image may be picked up after the second overall image is picked up.

Moreover, although in the inspection processing, a description has been given of the case where the overall images of the IC components 1 housed in the component tray 5 are separately acquired by the camera unit 22, the present embodiment is not limited to such a case. Instead of such a case, an image of a plurality of IC components 1 housed in the component tray 5 may be acquired collectively. After such a collective acquisition, the image is divided into individual images of the respective IC components 1, so that the processing similar to the inspection processing can be achieved.

Next, detailed description is given of inspection processing techniques performed in the bump inspection portion 64. Before description of the inspection processing techniques is provided, the shape types of the bumps 3 formed on the IC component 1 and their images are described with reference to the drawings.

Figure 13C:
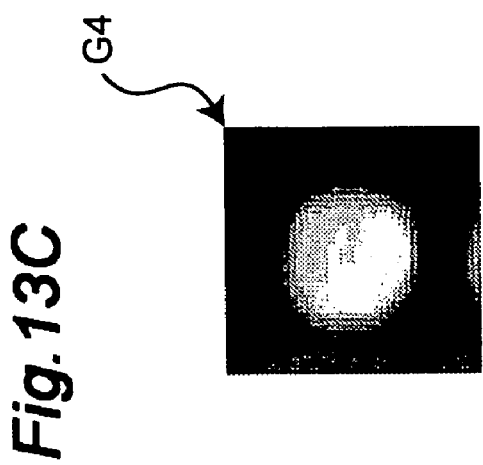
FIG. 13C is a view for showing a second bump inspection image of the bump picked up by using diffused light.
Figure 13B:
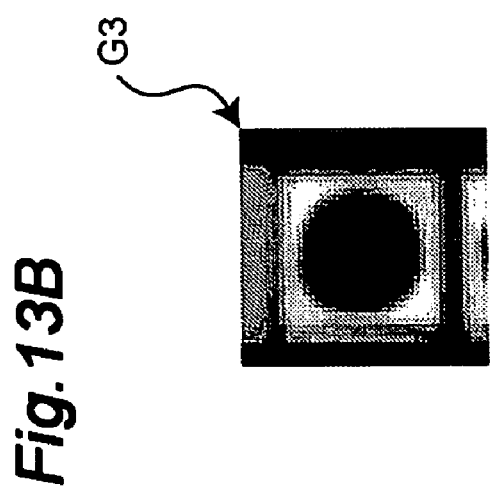
FIG. 13B is a view for showing a first bump inspection image of the bump picked up by using coaxial light.
Figure 13A:
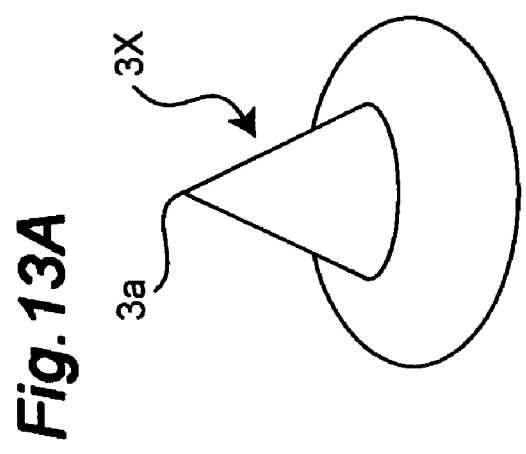
FIG. 13A is a schematic perspective view for showing a bump with a sharp vertex portion.

First, FIG. 13A shows a schematic view of a bump 3 having the vertex portion 3a without crush (in the case of specifically using a bump having such characteristics in shape, the bump is referred to as a bump 3X), FIG. 13B shows a view showing one example of the first bump inspection image G3 of the bump 3X picked up with the coaxial light W1, and FIG. 13C shows a view showing one example of the second bump inspection image G4 picked up with the diffused light W2.

As shown in FIG. 13B and FIG. 13C, the entire surface of the bump 3X in an almost conical shape appears black in the first bump inspection image G3, whereas it appears white in the second bump inspection image G4.

Figure 14A:
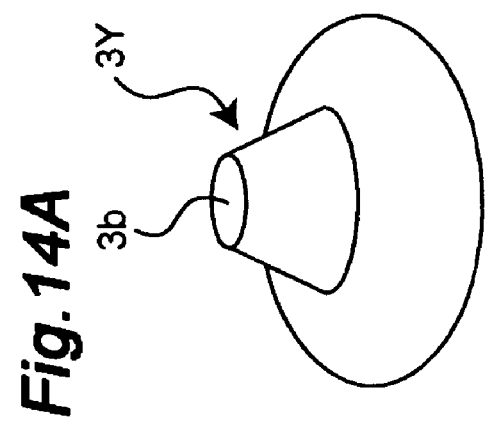
FIG. 14A is a schematic perspective view for showing a bump in the state of having a crushed plane on its vertex portion.
Figure 14B:
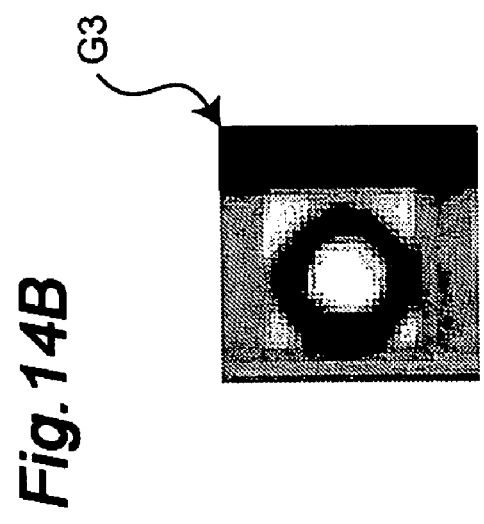
FIG. 14B is a view for showing a first bump inspection image of the bump picked up by using coaxial light.
Figure 14C:
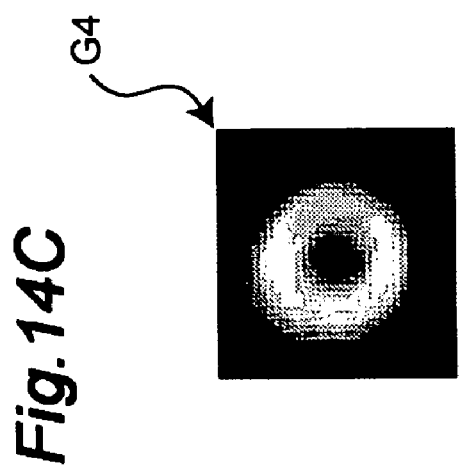
FIG. 14C is a view for showing a second bump inspection image of the bump picked up by using diffused light.

Next, FIG. 14A shows a schematic view of a bump 3 having a crushed plane 3b formed on the vertex portion 3a (in the case of specifically using a bump having such characteristics in shape, the bump is referred to as a bump 3Y), FIG. 14B shows a view showing one example of the first bump inspection image G3 of the bump 3Y picked up with the coaxial light W1, and FIG. 14C shows a view showing one example of the second bump inspection image G4 picked up with the diffused light W2.

As shown in FIG. 14B, the lateral surface of the bump 3Y appears black in the first bump inspection image G3, whereas the crushed plane 3b appears white. Contrary to this, as shown in FIG. 14C, in the second bump inspection image G4, the lateral surface of the bump 3Y appears white whereas the crushed plane 3b appears black.

Figure 15B:
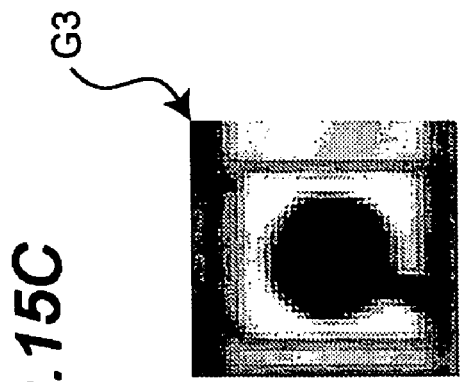
FIG. 15B is a view for showing a first bump inspection image of the bump picked up by using coaxial light.
Figure 15C:
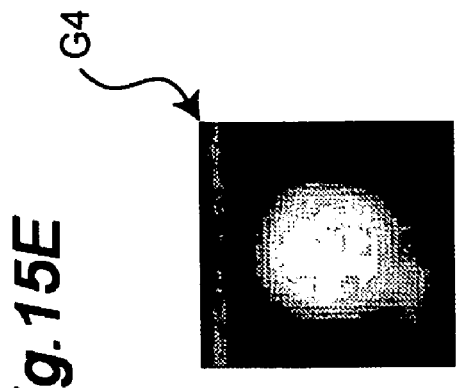
FIG. 15C is a view for showing a first bump inspection image of the bump picked up by using coaxial light.
Figure 15D:
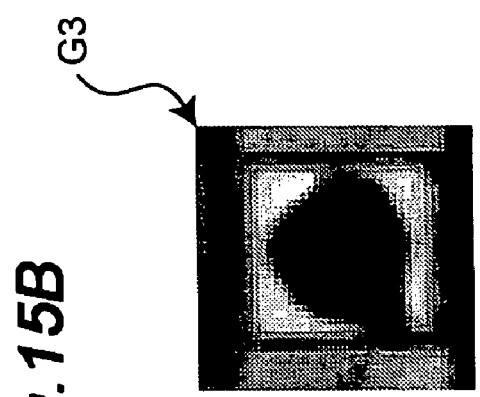
FIG. 15D is a view for showing a second bump inspection image of the bump picked up by using diffused light.
Figure 15E:
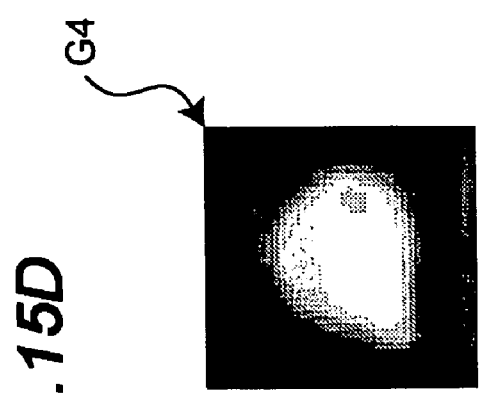
FIG. 15E is a view for showing a second bump inspection image of the bump picked up by using diffused light.
Figure 15A:
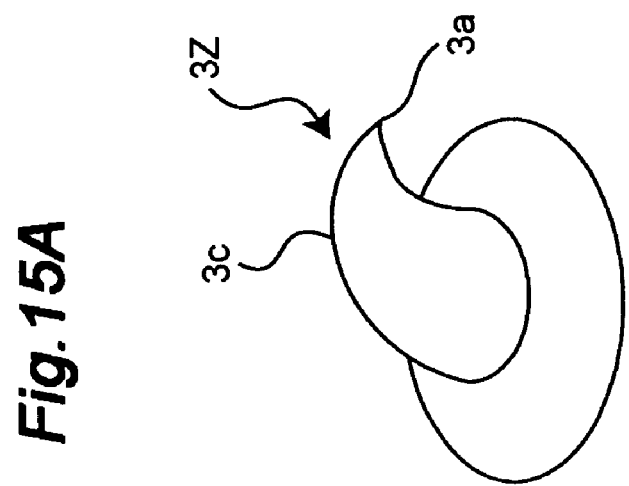
FIG. 15A is a schematic perspective view for showing a bump in the state of having a curved horn portion on its vertex portion.

Next, FIG. 15A shows a schematic view of a bump 3 having a curved horn portion 3c with the vertex portion 3a curved in the state of being largely displaced from its center position (in the case of specifically using a bump having such characteristics in shape, the bump is referred to as a bump 3Z), FIG. 15B and FIG. 15C show views showing one example of the first bump inspection image G3 of the bump 3Z picked up with the coaxial light W1, and FIG. 15D and FIG. 15E show views showing one example of the second bump inspection image G4 picked up with the diffused light W2.

As shown in FIG. 15B and FIG. 15C, in the first bump inspection images G3, the entire lateral surface of the bump 3Z appears black, and the image including the curved horn portion 3c is integrally black. The curved horn portion 3c forms an image region protruding outward from an almost circular-shaped outline of the bump 3Z. Moreover, as shown in FIG. 15D and FIG. 15E, in the second bump inspection images G4, the entire lateral surface of the bump 3Z appears white, and the image including the curved horn portion 3c is integrally white. Moreover, the curved horn portion 3c forms an image region protruding outward from an almost circular-shaped outline of the bump 3z.

(Detection Method for Bump-Formation Position)

Figure 12A:
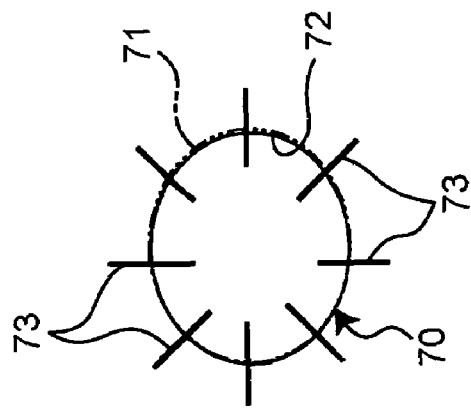
FIG. 12A is a schematic explanatory view for showing an inspection method for bump-formation positions in the bump inspection method in the first embodiment and is a view for showing the state in which a template is being matched with a part of an outline of a bump.
Figure 12B:
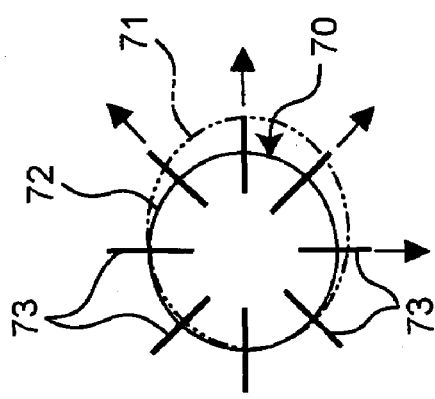
FIG. 12B is a schematic explanatory view for showing the inspection method for bump-formation positions in the bump inspection method in the first embodiment and is a view for showing the state in which the template is partially moved and changed.
Figure 12C:
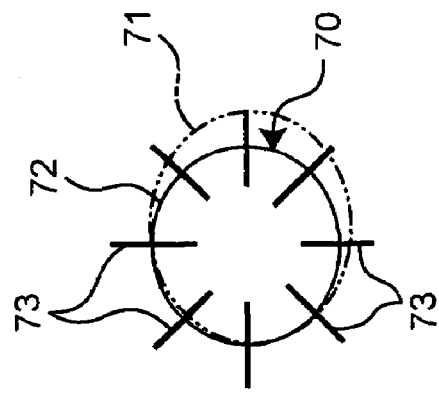
FIG. 12C is a schematic explanatory view for showing the inspection method for bump-formation positions in the bump inspection method in the first embodiment and is a view for showing the state in which the template is almost matched with the outline of the bump.

A description is now given of a technique for detecting bump-formation positions with use of such images. Schematic explanatory views for explaining the detection method are shown in FIG. 12A, FIG. 12B and FIG. 12C. As shown in FIG. 12A, the bump 3 has an almost circular-shaped outline in a planar view (shown by a chain double-dashed line in the drawing), though depending on its formation states, the bump 3 sometimes has a flattened oval outline. In order to accurately detect the formation position of the bump 3, it is necessary, even when the outline is in an oval shape or the like, to reliably recognize the outline shape and obtain the center position of the recognized outline so as to detect the center position as a formation position of the bump 3. Accordingly, in the present embodiment, a bump search template 70 is used as an example of the step function edge detection template which allows matching according to the outline shape even when the bump 3 has a flattened circular outline.

More specifically, as shown in FIG. 12A, the bump search template 70 has an approximately circular matching line portion 72 to be matched with an outline 71 of the bump 3, and a plurality of (i.e., 8) line-portion moving-and-changing bars 73 disposed at equal intervals on the matching line portion 72, e.g., disposed in positions of division lines dividing the matching line portion into 8 equal parts, for separately changing the matching line portion 72 at the respective division lines positions and in their vicinities along a normal direction so as to separately change partial curvatures in the matching line portion 72.

For example, the matching line portion 72 is formed to have a diameter of, for example, 70 μm in its initial state (state without movement and change), and further the respective line-portion moving-and-changing bars 73 are formed to have an outward length of 13.6 μm and an inward length of 13.6 μm in a normal direction of the matching line portion 72. Thus-formed matching line portion 72 can be partially moved and changed up to 13.6 μm outward in normal direction and up to 13.6 μm inward in normal direction in the positions where the respective line-portion moving-and-changing bars 73 are disposed, and such movement and change makes it possible to separately change partial curvatures of the matching line portion 72.

Moreover, the respective line-portion moving-and-changing bars 73 are capable of recognizing a boundary portion between a portion appearing white (i.e., bright portion) and a portion appearing black (dark portion) on a disposed image, and the matching line portion 72 can be partially moved and changed so that intersections of the line-portion moving-and-changing bars 73 with the matching line portion 72 are positioned in the thus-recognized boundary portion.

The method for detecting the formation position of the bump 3 is described in detail with use of such a bump search template 70. First, as shown in FIG. 12A, with use of the first bump inspection image G3 or the second bump inspection image G4, a part of the outline 71 of the bump 3 is matched with a part of the matching line portion 72 of the bump search template 70. More specifically, a bump search template 70 is disposed on an image so that a portion of the matching line portion 72 intersected with four line-portion moving-and-changing bars 73 disposed on the left-hand side as viewed in the drawing in the bump search template 70 is approximately matched with a left-hand side portion of the outline 71 of the bump 3. In this state, some portions of the matching line portion 72 intersected with four line-portion moving-and-changing bars 73 on the right-hand side as viewed in the drawing in the matching line portion 72 and a right-hand portion of the outline 71 are not matched. However, in these not-matched portions, some parts of the outline 71 of the bump 3 are disposed on the four line-portion moving-and-changing bars 73.

Then, as shown in FIG. 12B, in the four line-portion moving-and-changing bars 73 in the not-matched state, the function to recognize a boundary between the bright portion and the dark portion is used to recognize positions of intersection with the outline 71 of the bump 3, and the matching line portion 72 is partially and separately moved and changed (fitting change) so that the matching line portion 72 is positioned in the recognized respective intersection positions. More specifically, portions of the matching line portion 72 where the four line-portion moving-and-changing bars 73 are disposed are moved and changed outward in the respective normal directions. It is to be noted that in the case of such movement and change, the matching line portion 72 keeps its curved shape and never takes a square shape or the like.

With such movement and change, when the matching line portion 72 is roughly matched with the outline 71 of the bump 3 as shown in FIG. 12C, matching of the bump search template 70 with the outline 71 is achieved. Then, a center coordinate of the bump search template 70 in the matched state is calculated, and the calculated center coordinate is determined as the formation position of the bump 3. It is to be noted that in such a matching operation, 100% matching is often difficult to achieve in reality, and further, in consideration of the purpose of the matching operation which is to finally calculate the center coordinate in the matched state, matching of around 80% or more can be regarded as successful matching.

Although in the above description, description has been given of the case where the bump search template 70 has 8 line-portion moving-and-changing bars 73, the provided number of the line-portion moving-and-changing bars 73 is not limited to 8. In the case of performing high-precision detection or in the case where the bump is large in shape, the provided number of the line-portion moving-and-changing bars 73 can be increased to, for example, about 16 to 24. It is to be noted that in consideration of the function of such template matching, the provided number of the line-portion moving-and-changing bars 73 should preferably be at least 4 or more.

Description is given of the case where such a method for detecting bump-formation positions is performed with use of the second bump inspection image G4 acquired by radiating the diffused light W2 onto, for example, a bump 3Y having a crushed plane 3b as shown in FIG. 14C.

Figure 16B:
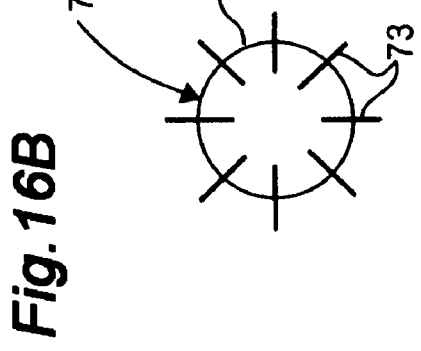
FIG. 16B is a view for showing the inspection method for bump-formation positions in the first embodiment and is a view for showing a template for use in the inspection.
Figure 16D:
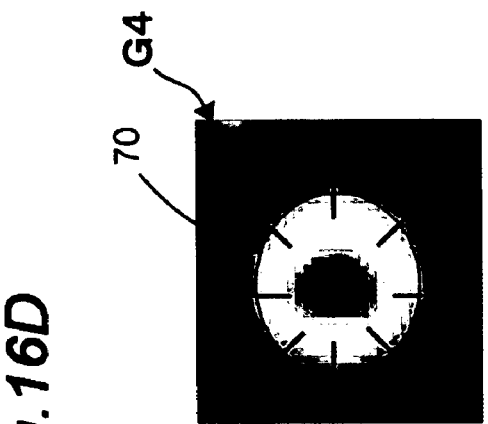
FIG. 16D is a view for showing the inspection method for bump-formation positions in the first embodiment and is a view for showing the state in which the template is deformed and is almost matched with the outline.
Figure 16A:
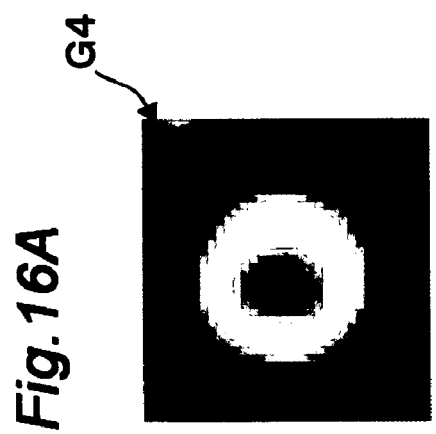
FIG. 16A is a view for showing an inspection method for bump-formation positions in the first embodiment and is a view for showing a second bump inspection image.
Figure 16C:
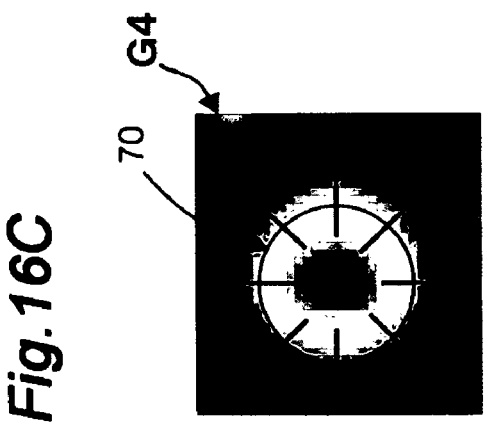
FIG. 16C is a view for showing the inspection method for bump-formation positions in the first embodiment and is a view for showing the state in which a part of the outline of the bump on the image is matched with the template.

As shown in FIG. 16A, first, the second bump inspection image G4 of the bump 3Y is read out from the image storage portion 61. A bump search template 70 shown in FIG. 16B is disposed on the read second bump inspection image G4, and the template is matched with a part of the outline 71 of the image of the bump having an almost circular-shaped white region. After the matching, the matching line portion 72 is changed and moved so that the matching line portion 72 is roughly matched with the outline 71 of the bump 3 (fitting). In the roughly matched state, a center coordinate of the matching line portion 72 is calculated to determine a formation position of the bump 3Y.

Although in such an inspection processing of the bump-formation position, description has been given of the case where the second bump inspection image G4 of a bump 3Y having a crushed plane 3b is used, the present embodiment is not limited to such a case. The inspection processing may be performed following the same procedures in the case of using any images of the bumps 3 having various shapes shown in FIG. 13A to FIG. 13C, FIG. 14A to FIG. 14C, and FIG. 15A to FIG. 15E instead.

However, in such inspection processing of the bump-formation position, use of the second bump inspection image G4 with the diffused light W2 is more preferable than use of the first bump inspection image G3 with the coaxial light W1. The coaxial light W1 is principally a method for "brightening portions other than the bump 3", which is not a method so as to actively acquire an image of the bump 3 itself. More particularly, in the case of the coaxial light W1, the pad portion around the bump 3 is brightened white so that an inside black portion is indirectly acquired as an image of the bump 3. However, the bump-formation surface S of the IC component 1 has other portions which appear black, and so in the case where, for example, the bump 3 is formed in the state of being displaced from the pad portion, the boundary of the outline of the bump 3 becomes indistinct, which makes it difficult to recognize the bump 3. Further, in the case where the coaxial light W1 is used, an image of various patterns such as IC patterns on the bump-formation surface S of the IC component 1 other than the bump 3 is also acquired, which may causes recognition failure of the bump or deteriorated precision. On the contrary, the diffused light W2 by nature contains less coaxial components and so the IC patterns and the like become less distinct. Because of these reasons, in the inspection processing of the bump-formation position, it can be said that it is preferable to use the second bump inspection image G4 with the diffused light W2 which allows only the bump 3 to be picked up with a high contrast.

(Inspection Method for the Degree of Crush in a Bump Vertex Portion)

Description is now given of a method for inspecting the degree of crush in the vertex portion 3a of a bump 3. Description is given of, for example, the case where such inspection of the degree of crush is performed on the bump 3Y having a crushed plane 3b as shown in FIG. 14A with use of a first bump inspection image G3 picked up with the coaxial light W2 shown in FIG. 14B.

Figure 17B:
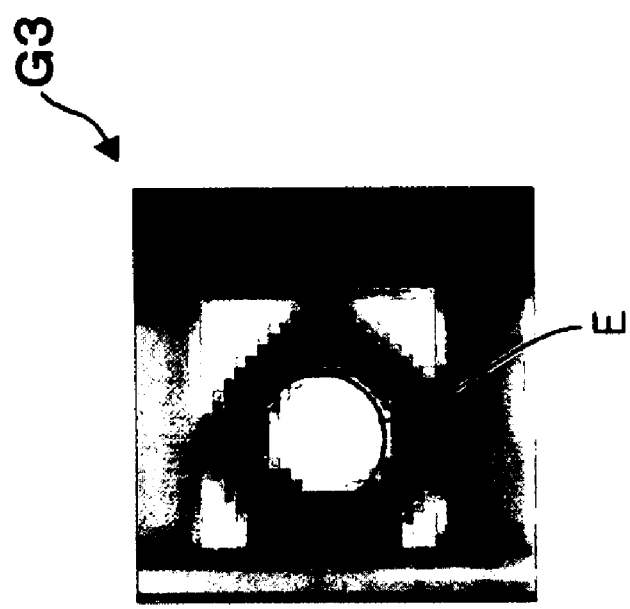
FIG. 17B a view for showing an inspection method for a degree of crush of the bumps in the first embodiment and is a view for showing the state in which an area of the crushed plane in the image is calculated.
Figure 17A:
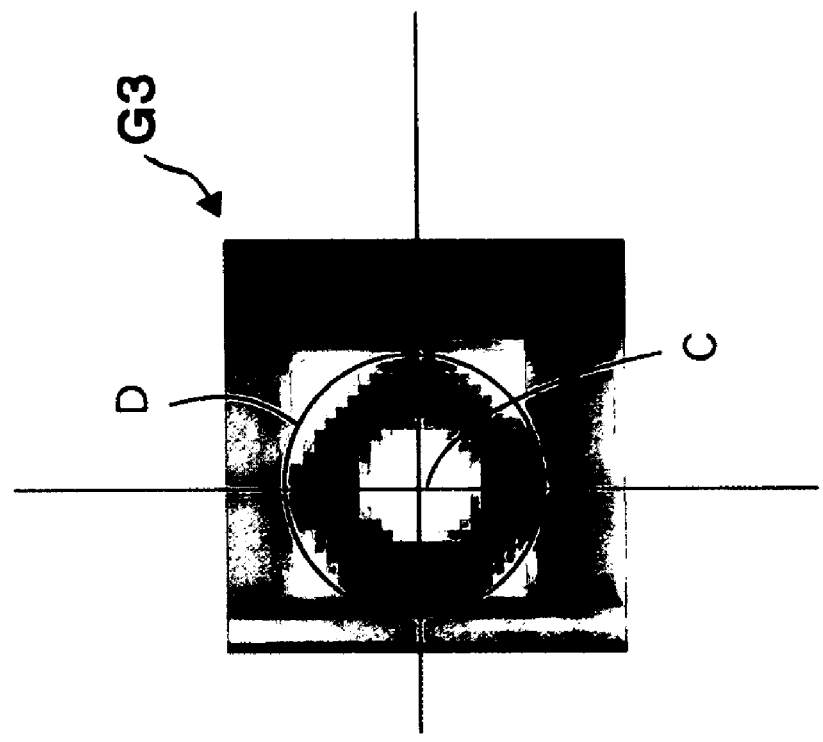
FIG. 17A is a view for showing an inspection method for a degree of crush of the bumps in the first embodiment and is a view for showing the state in which a formation position of a bump is detected in the first bump inspection image.

First, as shown in FIG. 17A, in the first bump inspection image G3 after the inspection of the bump-formation position, a specified range D from a center position C is set and an area of a white image region within the specified range D is calculated. More specifically, such a calculation is performed by a binary particle analysis processing method.

Then, as shown in FIG. 17B, a white image region E within the specified range D is detected and an area thereof is calculated. The calculated white image region E is roughly matched with the crushed plane 3b of the bump 3Y, and through calculation of the area, an area of the crushed plane 3b can be calculated. It is to be noted that the quality of the calculated area of the crushed plane 3b is determined by determining whether or not the calculated area of the crushed plane 3b is in a specified area value range or by other determination operations in the quality determination portion 65.

It is to be noted that in performing such an inspection of the degree of crush, use of the first bump inspection image G3 with the coaxial light W1 as described above may be replaced with use of the second bump inspection image G4 with the diffused light W2. However, in the case where high-precision inspection is required, it is preferable to use the first bump inspection image G3 with the coaxial light W1 in which a boundary between a white region and a black region on the image appears with more distinct contrast.

As shown in FIG. 5B, when the diffused light W2 is irradiated from the dome lighting unit 26 at considerably wide angles, the light irradiated onto the crushed plane 3b of the bump 3Y does not return to the camera unit 22, and therefore in the picked up second bump inspection image G4, a portion of the crushed plane 3b appears black, in the state of which the degree of crush can be inspected. However, when the diffused light W2 is used in this way, the crushed plane 3b of the bump 3Y is not demonstratively brightened but rather the crushed plane 3b is inspected by indirectly avoiding the crushed plane 3b to be brightened by an irradiation angle or an irradiation position of the diffused light W2. Therefore, depending on the irradiation angle or the irradiation position, components close to coaxial may be contained, and in such a case, the contrast of the crushed plane 3b in the picked up image is decreased and thereby inspection precision of the degree of crush is deteriorated. Because of these reasons, it can be said that it is preferable to inspect the degree of crush with use of the first bump inspection image G3 with the coaxial light W1.

Moreover, such crush of the vertex portion 3a of the bump 3 is sometimes actively formed by leveling processing performed on the respective bumps 3 included in the IC component 1.

(Detection Method for the Presence of an Anomaly in Bump Shape)

Description is now given of a method for inspecting whether or not the bump 3 has an anomaly in the shape itself. Such an inspection is performed to reliably detect a bump 3Z having a curved horn portion 3c formed by a vertex portion 3a being largely displaced from its center position as shown in FIG. 15A even when, for example, no anomaly is detected in the inspection of the formation position of the bump 3 or in the inspection of the degree of crush.

More specifically, as shown in FIG. 18A, after the formation position of the bump 3Z is detected by fitting the outline 71 in an image of such a bump 3Z to the bump search template 70, an almost annular inspection region F is disposed adjacent to the surrounding of the almost circular outline 71 of the bump 3Z as shown in FIG. 18B. After the disposition, an inspection is performed in the inspection region F to determine whether or not a part of the image of the bump 3Z is detected.

For example, in the case where a part 75 of the image of the bump 3Z is detected in the approximately annular inspection region F as shown in FIG. 18B, it is determined whether or not an area of the detected image region H is beyond a preset tolerance range, and if it is beyond the range, then it is determined that the bump 3Z has an anomalous shape.

It is to be noted that in such an inspection, any one of the images shown in FIG. 15B to FIG. 15E can be used.

Figure 19:
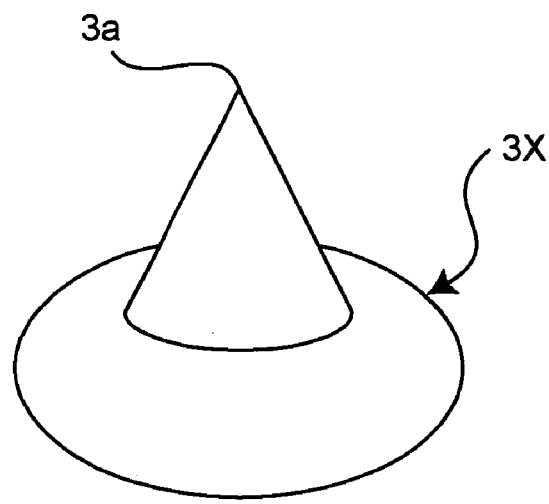
FIG. 19 is a schematic view of a bump for showing an inspection condition in the bump inspection method in the first embodiment.

A description is now given of the necessity of inspecting the degree of crush of the vertex portion 3a and one example of determination standards in inspection of the formation states of bumps. First, a schematic view of an almost conical-shaped bump 3X having a vertex portion 3a uncrushed is shown in FIG. 19, and a schematic view of a bump 3Y having a crushed plane 3b formed thereon is shown in FIG. 20.

Figure 20:
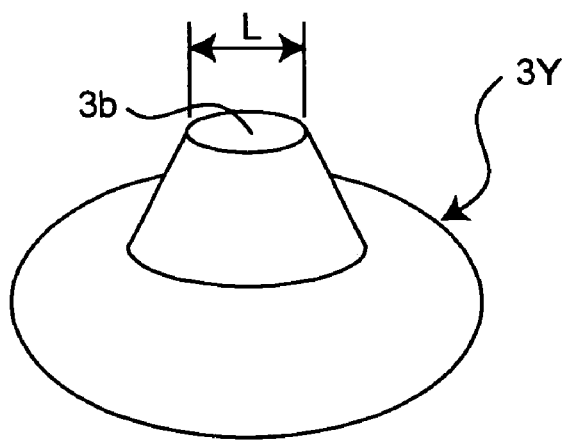
FIG. 20 is a schematic view of a bump for showing an inspection condition in the bump inspection method in the first embodiment.

There are mainly two kinds of mounting methods as a method for mounting an IC component 1 having such respective bumps 3 formed thereon on the board, and one method is a so-called SBB (Stud Bump Bonding) mounting method, in which the IC component 1 having bumps 3Y each having a crushed plane 3b formed thereon (i.e., the bumps 3Y to which a so-called leveling processing is applied) as shown in FIG. 20 is bonded to the board electrode on the board through a conductive bonding material to mount the IC component 1 on the board. The other method is a mounting method in which as shown in FIG. 19, an IC component 1 having bumps 3X each having the vertex portion 3a in a sharpened state without having a crushed portion is mounted on the board with breaking an insulative sheet member disposed on the board by the vertex portions 3a of the respective bumps 3X so as to bring the vertex portions 3a of the respective bumps 3X into contact with board electrodes.

First, in the SBB mounting method, the crushed plane 3b is formed in advance on each of the bumps 3Y, and the respective bumps 3Y are not crushed anymore in the mounting operation. Consequently, in view of reliable allocation of bonding areas and equalization of the bump height, it is necessary, at the point of forming the crushed planes 3b, to form the crushed planes 3b so as to have a specified range of area.

Moreover, as the area of the crushed plane 3b in each of the bump 3Y is made to fall within the specified range, the formation height of the respective bumps 3Y can be equalized. For example, as shown in FIG. 20, the condition that a diameter size L of the crushed plane 3b in the bump 3Y is 35 μm±15 μm may be set as the specified range.

Next, in the latter mounting method, it is required to reliably break through the sheet member with the vertex portions 3a of the bumps 3X. For this, it is preferable that the vertex portion 3a does not have a crushed plane 3b, though in reality, a very small crushed plane 3b is sometimes present. Accordingly, even if the crushed plane 3b is formed, it is desired that the crushed plane 3b is formed such that its area does not exceed a specified range which ensures the sheet member will be broken through. For example, as shown in FIG. 20, the condition that the diameter size L of the crushed plane 3b in the bump 3Y is less than 20 μm can be set as the specified range.

Moreover, in the above-stated inspection of the formation states of the bumps 3 in the bump inspection apparatus 101, the inspection may be performed, for example, under the following conditions. For example, inspection resolution is 3.4 μm/pixel, inspection precision (3σ) is 2 μm, and inspection items may be set as: a bump 3 should be formed; displacement of the formation position of the bump 3 should not be 10 μm or larger; a diameter size of the crushed plane 3b should not be 20 μm or larger; and a diameter size of the crushed plane 3b should be within a specified range. Further, a field size of the camera unit 22 may be set at 6.8 mm×6.8 mm, a time necessary for the inspection processing (i.e., inspection tact) may be set at 1.8 sec/IC component (provided that the quantity of bumps 3 formed in a single IC component 1 is not more than 200 units), an image pickup time is 160 msec/image, and a bump inspection time may be set at 4 msec/bump. By performing the inspection of the formation states of the bumps 3 under these conditions, effective inspection may be achieved.

According to the first embodiment, following various effects can be achieved.

First, in the bump inspection apparatus 101, instead of separately aligning the respective bumps 3 included in the IC component 1 and the image-pickup camera, and picking up images of individual bumps 3 in the state that individual IC components 1 are held, the overall image of the bump-formation surface S of the IC component 1 housed in the component tray 5 is picked up and bump inspection images of the respective bumps 3 are cut away from the picked up overall image for inspection of the respective bumps 3, by which the inspection precision can be less influenced by displacement which is associated with relative positioning of the bumps 3 and the image-pickup system such as the camera unit 22 in the bump inspection images Particularly, in the case where alignment between the respective bumps 3 and the image-pickup camera is performed separately as in the conventional inspection method, positioning precision among the respective bumps 3 may be dispersed, whereas in this embodiment, collective pickup of images of the respective bumps 3 formed on a single IC component 1 makes it possible to prevent such a problem from occurring.

Further, by picking up such an overall image of the IC component 1 and acquiring bump inspection images of the respective bumps 3 from the overall image through cutting, it becomes possible to eliminate involvement of a mechanical moving operation such as an alignment of the image-pickup camera and the respective bumps as in the conventional example, thereby allowing a time necessary for acquiring images of the respective bumps 3 to be shortened. Therefore, more efficient inspection becomes possible.

Moreover, pickup of such an overall image of the IC component 1 can be performed in the state that the IC components 1 are housed in the component tray 5, which makes it possible to prevent damage to the IC components 1 themselves or the bumps caused by the IC components 1 being grasped or by other reasons.

Moreover, in the bump inspection apparatus 101, the tray holding device 10 for holding the component tray 5 housing respective IC components 1, which are the image-pickup targets, at the inspection position P2 has lower-side support members 11 for supporting, from the lower side, opposite end portions of the component tray 5 and upper-side support members 12 for supporting the end portions supported by the respective lower-side support members 11 in such a way as to push down the end portions from the upper side. As a result, even in the case where the component tray 5 has warp or deflection, the component tray 5 may be held while being kept in an almost horizontal state with the warp or deflection being corrected. Particularly, in such an inspection of the formation states by acquiring images of the bumps 3, variation in distance between the image-pickup system and the image-pickup target causes variation in size and the like of the respective picked up images, and the presence of such variation affects the inspection precision of the respective bumps 3. However, since the component tray 5 for housing the respective IC components 1 which are the image-pickup targets is supported in an almost horizontal state with its warp and the like being corrected, a distance dimension between the respective IC components 1 and the camera unit 22 can be kept almost constant. Therefore, even in the case where images of the IC components 1 are acquired in the state of being housed in the component tray 5, high-precision inspection can be implemented.

Moreover, during alignment between the image-pickup system and the image-pickup target, fixing the component tray 5 and moving the camera unit 22 by the image-pickup movement device 28 make it possible to prevent the respective IC components 1 housed in the component tray 5 from jumping out of the component tray 5 because of the alignment operation.

Further, adopting the telecentric lens 22a as the optical lens included in the camera unit 22 in the image-pickup device 20 enables the picked up images to be far less influenced by dispersion in the distance dimension between the image-pickup system and the image-pickup target in the image pickup operation, thereby making it possible to implement high-precision inspection.

Moreover, the lighting device 24 has the coaxial lighting unit 25 and the dome lighting unit 26 which radiate two kinds of light different in their characteristics, so that in the case where, for example, the degree of crush of the vertex portion 3a of the bump 3 is inspected, use of an image produced by coaxial light W1 radiated from the coaxial lighting unit 25 makes it possible to define the contrast of the crushed plane 3b, thereby allowing accurate inspection of the degree of crush, whereas in the case where the entire shape of the bump 3 is inspected, use of an image produced by diffused light W2 irradiated from the dome lighting unit 26 makes it possible to define the outline of the bump 3, thereby allowing accurate inspection of the entire shape. Therefore, in conformity with various inspection contents demanded for the inspection of the bump 3, selectively using images picked up by two kinds of lighting different in their characteristics allows more reliable inspection to be implemented.

Moreover, in the inspection of the formation positions of the bumps 3, the inspection of the degree of crush, and inspection of the presence of anomalous shapes with use of the respective bump inspection images, using inspection techniques (inspection logics) according to the above-stated respective inspections makes it possible to implement the respective inspections specifically and reliably, thereby making it possible to provide a high-precision bump inspection method.

Moreover, the bump inspection apparatus 101 is not structured integrally with a bump formation apparatus but is structured independently thereof, so that the bump inspection apparatus 101 is not influenced by a time necessary for forming bumps in the bump formation apparatus and therefore can perform inspection individually. This makes it possible to realize various applications of the bump inspection apparatus 101 including singular use and use in conjunction with various apparatuses, thereby making it possible to enhance freedom in the application forms of the inspection apparatus.

Second Embodiment

It is to be noted that the present invention is not limited to the above embodiment, and is applicable in various other forms. For example, a bump inspection apparatus 201 according to a second embodiment of the present invention relates to a structure in which such a bump inspection apparatus 201 is associated with other apparatuses in terms of control. The specific structure thereof is shown in a schematic structure view of FIG. 21. It is to be noted that in the bump inspection apparatus 201 in the second embodiment, component members having structures identical to those of the bump inspection apparatus 101 in the first embodiment are designated by identical reference numerals and description thereof will be omitted.

Figure 21:
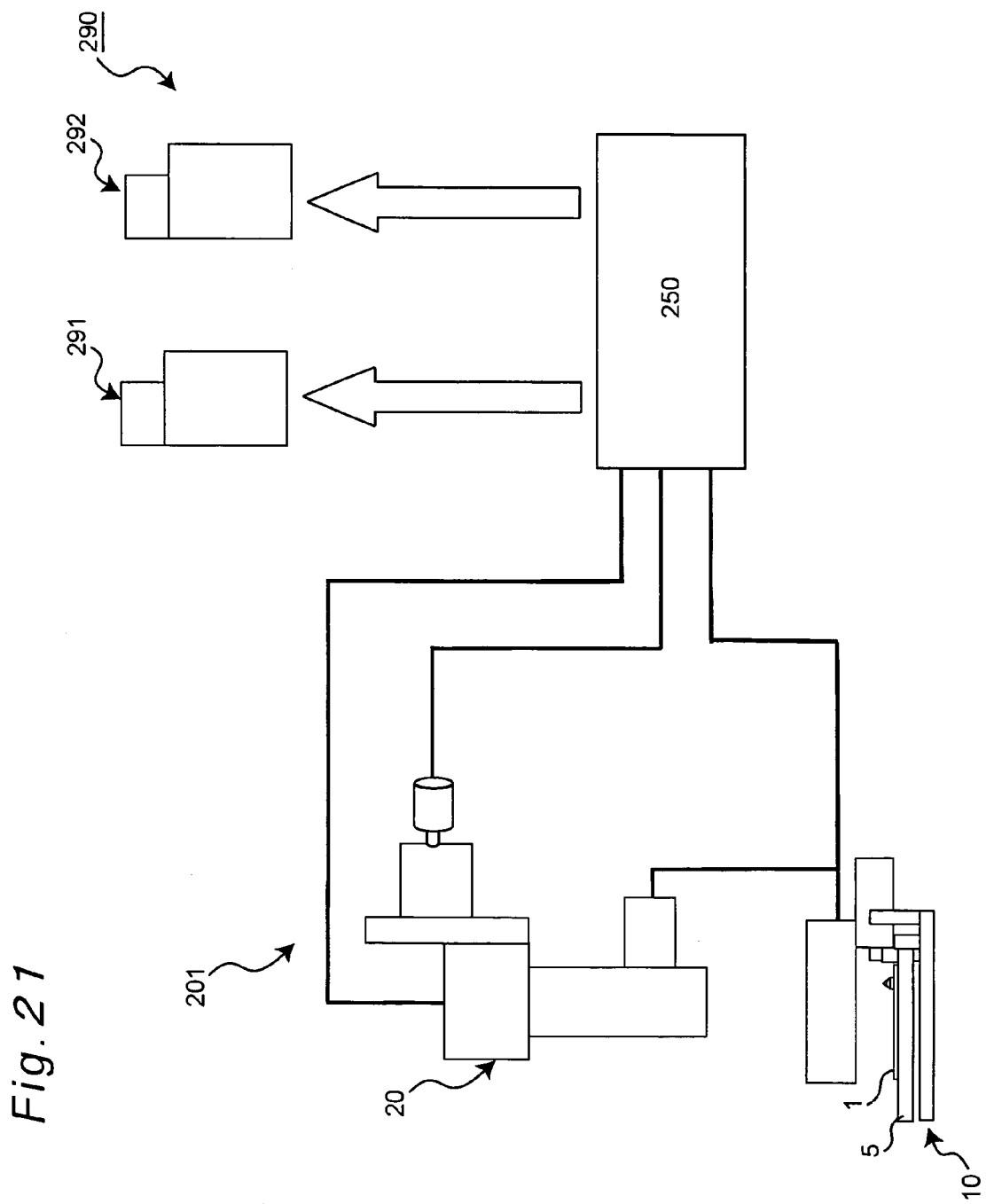
FIG. 21 is a schematic structure view for showing the structure of an IC component mounted-board manufacturing apparatus having a bump inspection apparatus according a second embodiment of the present invention.

As shown in FIG. 21, the bump inspection apparatus 201 has almost the same structure as the bump inspection apparatus 101 in the first embodiment. Further, the bump inspection apparatus 201 is capable of performing bump inspection on respective IC components 1 fed from a bump formation apparatus 291 which is capable of performing a bump formation process for forming bumps 3 on IC components 1. Moreover, the respective IC components 1 subjected to bump inspection in the bump inspection apparatus 201 can be fed to a component mounting apparatus 292 which is capable of performing a component mounting process for mounting the respective IC components 1 on boards.

More particularly, an IC component-mounted board manufacturing apparatus 290 is structured such that the IC component 1 on which the bumps 3 are formed in the bump formation apparatus 291 is fed to the bump inspection apparatus 201, where the formation states of the respective bumps 3 on the IC component 1 are inspected, and then the IC component 1 is fed to the component mounting apparatus 292, where the IC component 1 is mounted on the board through the bumps 3.

In such an IC component-mounted board manufacturing apparatus 290, a control device 250 included in the bump inspection apparatus 201 and control devices included in the bump formation apparatus 291 and the component mounting apparatus 292 are connected in terms of a control operation, and among the apparatuses, information on control can be exchanged.

With such structure of the IC component-mounted board manufacturing apparatus 290, information on the inspection results of the bumps 3 on the respective IC components 1 obtained in the bump inspection apparatus 201 can be transmitted from the control device 250 of the bump inspection apparatus 201 to the bump formation apparatus 291 or the component mounting apparatus 292 where necessary. The bump formation apparatus 291 which receives such feedback information on the inspection results can perform the next bump formation process based on the information, and also the component mounting apparatus 292 which receives feedforward information on the inspection results can perform the mounting process of an IC component corresponding to the inspection result based on the information.

More specifically, in the case where, for example, the bump inspection apparatus 201 detects an IC component 1 having a failure in the vertex portion 3a of a bump 3, information on an abnormal quantity of the vertex portion 3a and the failure portion is fed back to the bump formation apparatus 291 which formed the bump 3 on the IC component 1 (in the case where a plurality of bump formation apparatuses 291 are present, a specific apparatus is identified). If the crush quantity of bumps 3 at a specific position constantly shows anomaly, such causes as foreign matters being present in a leveling mechanism for respective bumps 3 included in the bump formation apparatus 291 can be considered, and in such cases, measures including issuing an anomaly alarm to the bump formation apparatus 291 and outputting a cleaning operation execution signal can be taken.

Moreover, in the component mounting apparatus 292, although the component mounting apparatus 292 is free from anomaly in the formation positions of the bumps 3 and the like, information on a displacement quantity in the formation positions are fed forward to the component mounting apparatus 292 together with information to identify IC components 1 so that the component mounting apparatus 292 can perform the mounting process of the IC components 1 while correcting the displacement quantity.

It is to be noted that the various information outputted from the bump inspection apparatus 201 includes, for example, displacement quantity of bump-formation positions, bump size, bump crush quantity, positional information on failed bumps in an IC component 1 and manufacturing lot number.

Figure 22:
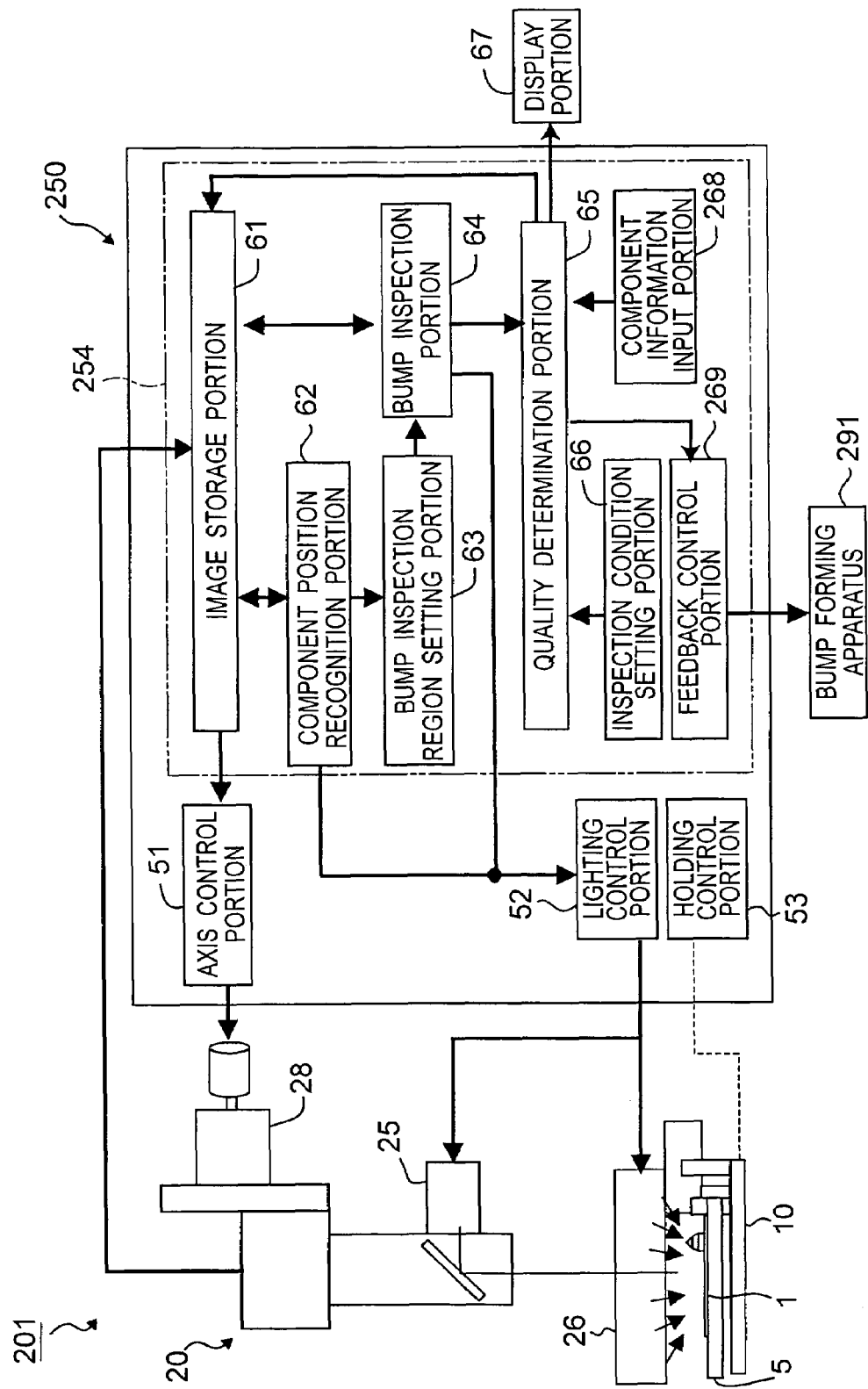
FIG. 22 is a control block diagram for showing the structure for performing feedback control in the bump inspection apparatus in the second embodiment.
Figure 23:
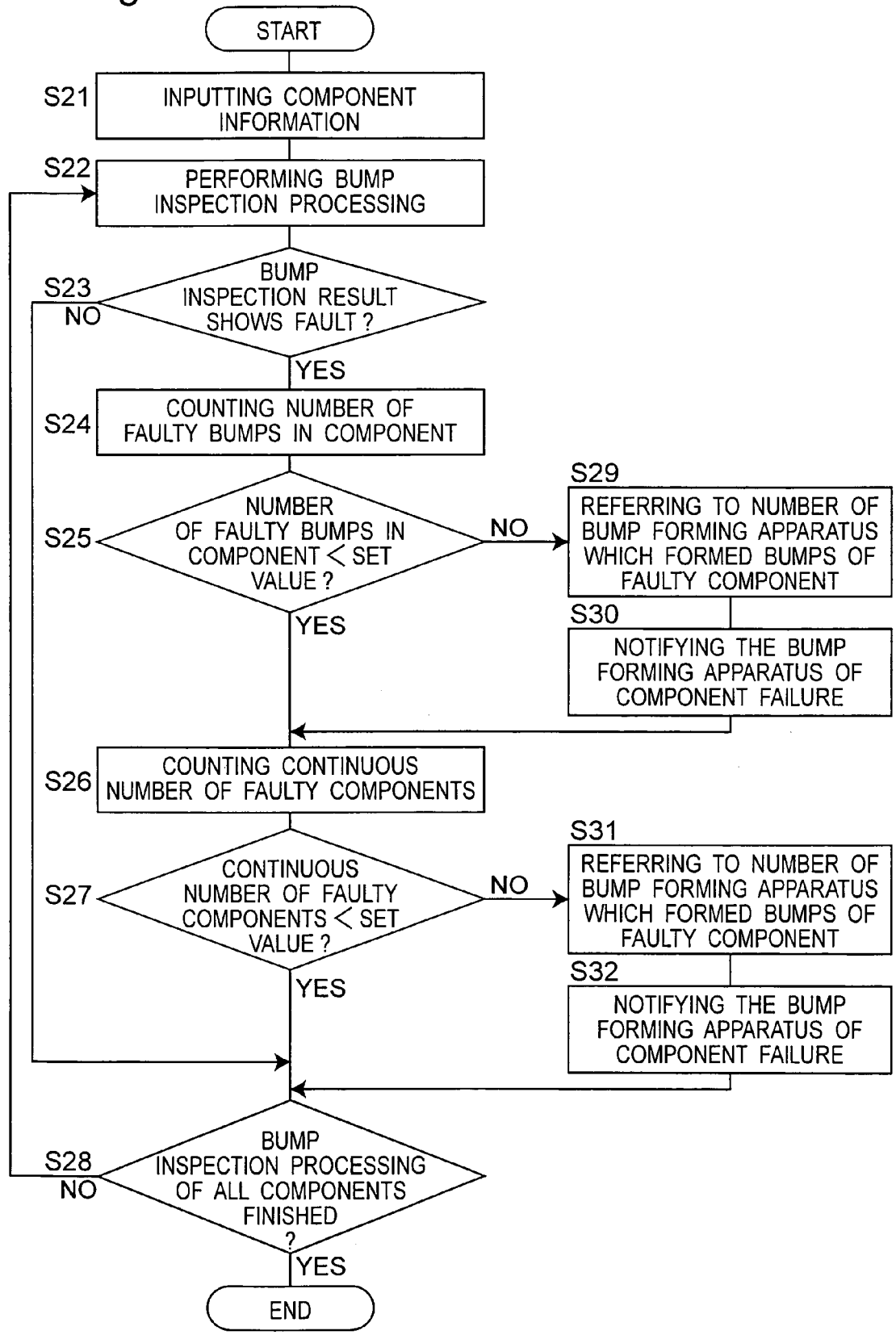
FIG. 23 is a flowchart for showing the procedure of the feedback control.
Figure 24:
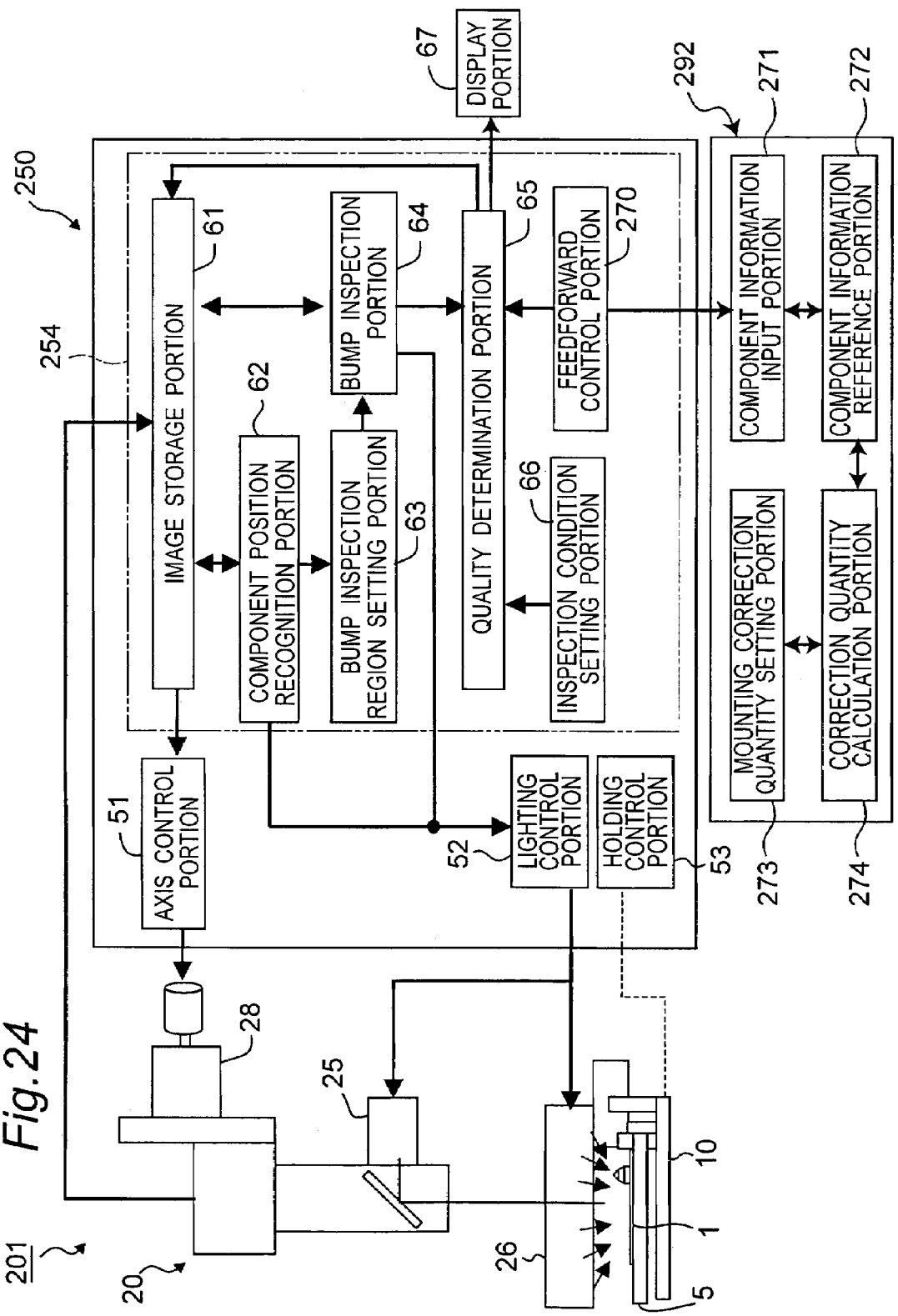
FIG. 24 is a control block diagram for showing the structure for performing feedforward control in the bump inspection apparatus in the second embodiment.
Figure 25:
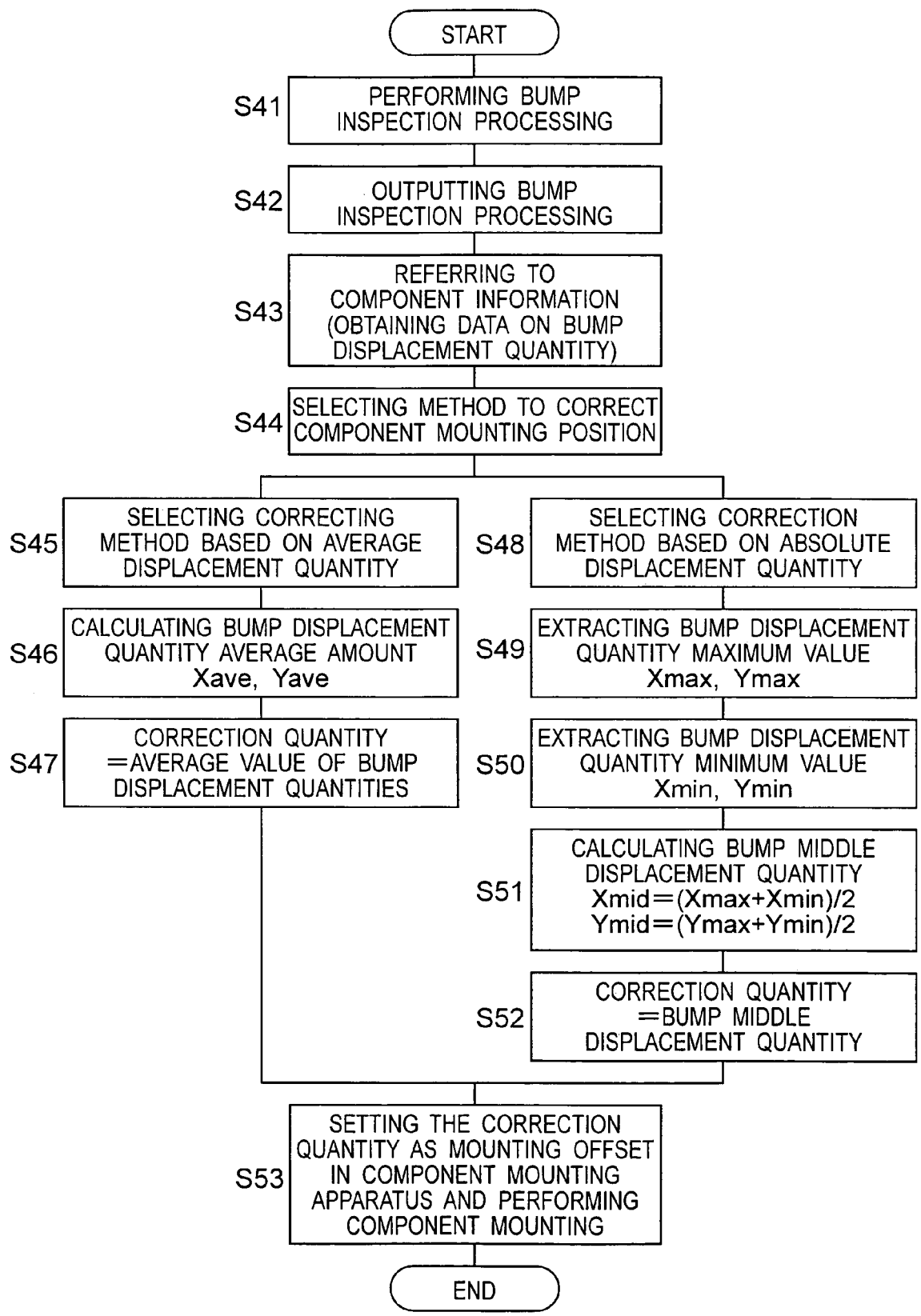
FIG. 25 is a flowchart for showing the procedure in the feedforward control.

Description is herein given of, with reference to the drawing, an example of specific details of feedback control between the bump inspection apparatus 201 and the bump formation apparatus 291 and feedforward control between the bump inspection apparatus 201 and the component mounting apparatus 292. For the description, a control block diagram showing a control structure with respect to the feedback control is shown in FIG. 22, and a flowchart for showing the primary procedures in control operation in the feedback control is shown in FIG. 23. Moreover, a control block diagram for showing a control structure in respect with the forward control is shown in FIG. 24, and a flowchart for showing the primary procedures in control operation in the feedback control is shown in FIG. 25.

(Feedback Control)

First, description is given of the specific details of the feedback control from the bump inspection apparatus 201 to the bump formation apparatus 291 with use of information on the result of bump inspection processing. As shown in FIG. 22, an inspection control portion 254 in the control device 250 in the bump inspection apparatus 201 includes, in addition to the respective component parts described in the first embodiment, a component information input portion 268 for inputting information on components, the information including lot number of the IC components 1, component (identification) number of the IC components 1, and apparatus (identification) number of the bump formation apparatuses which formed bumps 3 on the IC components 1, into the quality determination portion 65, and a feedback control portion 269 for receiving the results of bump inspection processing performed in the control device 250 from the quality determination portion 65 and outputting information on the processing results to the bump formation apparatus 291.

In a bump inspection apparatus 201 having such a structure, first, in step S21 in the flowchart in FIG. 23, the component information input portion 268 receives an input of component information including lot number and component number of the IC component 1, and apparatus number of the bump formation apparatus as preparation for bump inspection processing. Then, the component information is inputted from the component information input portion 268 into the quality determination portion 65, and in the inspection control portion 254, bump inspection processing of one IC component 1 is performed (step S22).

Next, a result of the bump inspection processing is determined in the quality determination portion 65 (step S23). As a result of the quality determination in the quality determination portion 65, if the IC component 1 that is the inspection target is determined to have any faulty bumps 3, then the number of faulty bumps 3 in the IC component 1 is counted (stored) in step S24. Further, in step S25, it is determined whether or not the number of faulty bumps 3 in the IC component 1 is less than a preset and inputted set value, and if it is determined that the number is equal to or beyond the set value, then in step S29, the information on the bump formation apparatus number from the component information inputted from the component information input portion 268 is used to identify the bump formation apparatus which is responsible for forming the faulty bumps 3. Then, the information is inputted from the quality determination portion 65 to the feedback control portion 269, and the feedback control portion 269 sends alarm information notifying that the faulty bumps 3 were formed in the IC component 1 identified by the lot number and the component number to the bump formation apparatus 291 identified by the bump formation apparatus number, by which information on the result of inspection processing is fed back. The alarm information is displayed, for example, in the bump formation apparatus 291 so as to enable an operator to recognize it.

In the quality determination portion 65, if generation of faulty bumps 3 continuously occurs in respective IC components 1 which undergo in sequence the inspection processing, then the continuous number of the faulty components is counted (stored) (step S26). For example, in the case where faulty bumps 3 are detected in an IC component 1 which underwent inspection processing earlier, and faulty bumps 3 are also detected in an IC component 1 which underwent inspection processing next, the count of the continuous number of the faulty components is 2. It is to be noted that if it is determined that the number of the faulty bumps 3 counted in one IC component 1 is below the set value in step S25, then processing in steps S29 and S30 are not performed but processing in step S26 is performed.

Then, in the quality determination portion 65, it is determined whether or not the count of the continuous number of the faulty components is below the preset set value (step S27). If it is determined that the continuous number of the faulty components reached the set value, then the component information inputted into the component information input portion 268 is referred in step S31, and a bump formation apparatus 291 which formed the bumps 3 on the pertinent IC component 1 is identified. Once the bump formation apparatus 291 is identified, alarm information notifying continuous generation of faulty components is sent from the feedback control portion 269 to the bump formation apparatus 291, by which information on the result of inspection processing is fed back (step S32). In the bump formation apparatus 291, for example, the alarm information is displayed so as to enable an operator to recognize it.

Then, in step S28, it is determined whether or not the bump inspection processing of all the IC components 1 which are the inspection targets, more specifically, all the IC components 1 housed in the component tray 5, is finished. It is to be noted that in step S23, if it is determined that any faulty bump 3 is not present as a result of bump inspection processing, then processing in the step S28 is performed while the respective processing in S24, S25, S29, S30, S26, S27, S31 and S632 are not performed.

In step S28, if it is determined that there is still an IC component 1 which has not yet undergone inspection processing, then in step S22, bump inspection processing is performed on the IC component 1, and the processing in the above-stated respective steps are performed in sequence. If it is determined that the bump inspection processing of all the IC components 1 is finished in step S28, then the bump inspection processing is completed.

Although description has been given of the case where the processing in steps S25, S29, S27, S31 in the flowchart in FIG. 23 are performed in the quality determination portion 65, this processing may be performed in the feedback control portion 269.

Moreover, as a specific application of the set value of the number of faulty bumps 3 in step S25, for example, two set values, a first set value and a second set value larger than the first set value, may be set and if the number of faulty bumps 3 is equal to or larger than the first set value and is smaller than the second set value, then alarm information indicating generation of faulty components may be sent to a pertinent bump formation apparatus 291, whereas if the number of faulty bumps 3 is equal to or larger than the second set value, then an apparatus stop signal may be outputted to the pertinent bump formation apparatus 291 to stop bump formation by the bump formation apparatus 291 so as to suppress mass generation of faulty components.

Similarly, as a specific application of the set value of the continuous number of faulty components in step S27 in FIG. 23, for example, two set values, a first set value and a second set value larger than the first set value, may be set and if the continuous number of faulty components is equal to or larger than the first set value and is smaller than the second set value, then alarm information indicating continuous generation of faulty components may be sent to a pertinent bump formation apparatus 291, whereas if the continuous number of faulty components is equal to or larger than the second set value, then an apparatus stop signal may be outputted to the pertinent bump formation apparatus 291 to stop bump operation by the bump formation apparatus 291 so as to suppress mass generation of faulty components.

(Feedforward Control)

Next, description is given of the specific details of the feedforward control from the bump inspection apparatus 201 to the component mounting apparatus 292 with use of information on the result of bump inspection processing. As shown in FIG. 24, an inspection control portion 254 in the control device 250 in the bump inspection apparatus 201 further includes, in addition to the respective component parts described in the above embodiment, a feedforward control portion 270 for outputting information on the processing results in the quality determination portion 65 to the component mounting apparatus 292 for feedforward control. Moreover, a control device in the component mounting apparatus 292 has a component information input portion 271 for receiving inputs of inspection result information associated with component (identification) number of an IC component 1, i.e., information on the displacement quantity of the formation position of bumps 3 and information on number of the bumps 3 formed in the IC component 1 as component information from the feedforward control portion 270 and retaining (storing) the information, and a component information reference portion 272 for referring to necessary information from component information retained in the component information input portion 271. Further, the control device in the component mounting apparatus 292 has a correction quantity calculation portion 274 for performing calculation processing of a correction quantity based on the displacement quantity of the bumps 3 during mounting of the IC component 1 with use of the component information obtained by the component information reference portion 272, and a mounting correction quantity setting portion 273 for setting the correction quantity calculated in the correction quantity calculation portion 274 as a mounting offset value during mounting of the IC component 1.

In a bump inspection apparatus 201 with such a structure, first, in step S41 in a flowchart in FIG. 25, bump inspection processing is performed on respective IC components 1. Information on the result of the bump inspection processing is inputted from the quality determination portion 65 into the feedforward control portion 270, and outputted from the feedforward control portion 270 and inputted into the component information input portion 271 in the component mounting apparatus 292 so as to be stored therein as component information (step S42). Herein, the component information refers to data on a displacement quantity of the formation position of each bump 3 associated with component number of an IC component 1, i.e., data on bump displacement quantities (X, Y) and the formation number of bumps 3 (number of bumps). Next, in the control device in the component mounting apparatus 292, among component information on each IC component 1 retained in the component information input portion 271, component information on one IC component 1 is retrieved by the component information reference portion 272 and the data on the bump displacement quantities and the formation number of bumps 3 are obtained (step S43).

Next, in step S44, a correction method for correcting a displacement quantity of a mounting position of the IC component 1 attributed to the displacement quantities of the bump-formation positions is selected out of the following two methods. The first correction method is a method for calculating a correction quantity by averaging respective bump displacement quantities in the respective bumps 3 in the IC component 1, while the second correction method is a method based on an absolute displacement quantity, in which among respective bump displacement quantities in the respective bumps 3 in the IC component 1, a middle value between a maximum displacement quantity and a minimum displacement quantity is calculated as a correction quantity. Such a selection of the correction method is performed by an operator.

First, in the case where the first correction method is selected in step S45, the component information obtained by the component information reference portion 272 is inputted into the correction quantity calculation portion 274. In the correction quantity calculation portion 274, an average value $(X_{avg}, Y_{avg})$ of the bump displacement quantities is calculated with use of the data on the displacement quantities (X, Y) of the formation positions of the respective bumps 3 and the formation number of the bumps 3 in the IC component 1 in the component information (step S46), and an average value of the bump displacement quantities is set as a correction quantity (step S47).

In the case were the second correction method (correction method based on the absolute displacement quantity) is selected in step S48, the component information obtained in the component information reference portion 272 is inputted into the correction quantity calculation portion 274, and out of the inputted component information, a maximum value $(X_{max}, Y_{max})$ of bump displacement quantities is extracted (step S49), and a minimum value $(X_{min}, Y_{min})$ of bump displacement quantities is extracted (step S50). Then, in step S51, in the correction quantity calculation portion 274, a bump middle displacement quantity $(X_{mid}, Y_{mid})$ is calculated by using the extracted bump displacement maximum value and minimum value (step S51), and the thus-calculated middle displacement quantity is set as a correction quantity (step S52).

Moreover, in step S47 or S52, once the correction quantity is set by the first correction method or the second correction method, the correction quantity is inputted from the correction quantity calculation portion 274 into the mounting correction quantity setting portion 273, where the correction quantity is set as a mounting offset value that is a displacement correction quantity in component mounting (S53).

In the component mounting apparatus 292, the mounting operation of the IC component 1 on the board is performed with use of the mounting offset value set by such a feedforward control, while the mounting position of the IC component 1 on the board is corrected. This makes it possible to achieve component mounting by reflecting displacement quantities of the formation positions of the bumps 3 in the IC component 1.

It is to be noted that the first correction method is relatively effective when the range of the bump displacement quantities of respective bumps 3 formed in an IC component 1 is relatively small or displacement occurs only in several bumps 3, whereas the second correction method is effective when the range of the bump displacement quantities of respective bumps 3 is relatively large.

Thus, various information sets on the formation states of the bumps 3 obtained by the bump inspection apparatus 201 are fed back to the bump formation apparatus 291 positioned upstream, so that based on the inspection results, anomalies in the formation states of the bumps may be discovered early. Particularly, such IC components 1 are often relatively expensive, and therefore early detection of faulty components is effective for suppressing increase in production costs.

Moreover, in the case where it is determined that a value in an inspection result is within a tolerance range but is near to the boundary of the tolerance range, it is effective to perform early feedback of the information to the bump formation apparatus 291 and inform an operator or the like in advance that maintenance of the apparatus will be due soon.

Moreover, feedforward operation of the information to the component mounting apparatus 292 makes it possible to mount IC components 1 based on the information, which allows mounting with higher precision.

Although in the respective embodiments, description has been given of the case where the formation states of the respective bumps 3 are inspected in the state that IC components 1 are housed in the component tray 5, the present invention is not limited to such a case. Instead, the present invention is applicable to the case where, for example, respective IC components are fed in a wafer state without using the component tray, and in this state, the formation states of the bumps are inspected.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-162919 filed on Jun. 1, 2004, including specification, drawing and claims, is incorporated herein by reference in its entirety.

What is claimed is:

1. A bump inspection apparatus for IC components, the apparatus comprising:
   a tray holding device for holding a component housing tray which houses a plurality of IC components, the plurality of IC components having respective bump-formation surfaces with a plurality of bumps formed in predetermined formation positions thereon, the plurality of IC components being arranged separately in an array with respective bump-formation surfaces facing up;
   an image-pickup device for picking up images of respective IC components housed in the component housing tray; and
   a control device for controlling the image-pickup device, the tray holding device, and inspection processing of bumps using the picked up images, wherein
   the image-pickup device comprises:
      an image-pickup camera unit for picking up one or more overall images of an IC component, the image-pickup camera unit having an optical axis along a direction approximately orthogonal to a bump-formation surface of the IC component; and
      an image-pickup optical-axis positioning unit for aligning the optical axis of the image-pickup camera unit with an approximate center position of the IC component,
   the control device comprises:
      a component position recognition portion for recognizing a position of the IC component on a basis of at least one of the one or more overall images picked up by the image-pickup camera unit;
      a bump inspection region setting portion for acquiring bump inspection images of respective bumps on the IC component from the one or more overall images on a basis of a position recognition by the component position recognition portion and the predetermined formation positions; and
      an inspection processing portion for determining positions of the respective bumps on a basis of the bump inspection images and determining degrees of crush of vertex portions of the respective bumps, and
   the tray holding device comprises:
      a pair of support members for supporting lower sides of respective opposing end portions of the component housing tray;
      a pair of pressing-and-holding members for pressing respective opposing end portions of the component housing tray from an upper side, so as to correct warp or deflection of the component housing tray and hold the component housing tray in an approximately horizontal posture; and
      a pressing-and-holding member movement device for integrally moving the pair of pressing-and-holding members between a holding position for holding the component housing tray and a holding cancel position.

2. The bump inspection apparatus for IC components as defined in claim 1, wherein
the inspection processing portion disposes an approximately annular inspection region about a determined position of a respective bump in a bump inspection image of the bump inspection images, and determines if a part of an image of the respective bump is present in the inspection region.

3. The bump inspection apparatus for IC components as defined in claim 1, wherein the image-pickup camera unit includes a telecentric lens as an optical lens.

4. The bump inspection apparatus for IC components as defined in claim 1, wherein
the image-pickup device further comprises a lighting device having a unidirectional-light irradiating unit for radiating approximately unidirectional light along the optical axis onto the bump-formation surface of the IC component and an inclined-directional-light irradiating unit for radiating light along a plurality of directions inclined to the optical axis onto the bump-formation surface of the IC component,
the control device further comprises an image storage portion for receiving and readably storing a first overall image, which is an overall image acquired while the unidirectional light is radiated, and a second overall image, which is an overall image acquired while the inclined-directional light is radiated,
the one or more overall images comprise the first overall image and the second overall image and the component position recognition portion reads the first overall image or the second overall image from the image storage portion,
the bump inspection region setting portion reads the first overall image and the second overall image from the image storage portion and the bump inspection images comprise first bump inspection images of the respective bumps from the first overall image and second bump inspection images of the respective bumps from the second overall image, and
the inspection processing portion determines positions of the respective bumps on a basis of the first bump inspection images or the second bump inspection images and determines the degrees of crush of the vertex portions of the respective bumps on a basis of the first bump inspection images.

5. The bump inspection apparatus for IC components as defined in claim 4, wherein
the inspection processing portion determines a position of a bump of the respective bumps by detecting an outline of the bump in a bump inspection image of the bump inspection images and determining a center position of the outline,
the inspection processing portion comprises a step function edge detection template having an initially approximately circular matching line portion, and a plurality of line-portion moving-and-changing bars, the moving-and-changing bars being initially set along normal directions to the matching line portion at positions approximately dividing the matching line portion into at least quarters, the moving-and-changing bars being for moving and changing the matching line portion in respective vicinities of the moving-and-changing bars in a direction along the respective moving-and-changing bars, and
the inspection processing portion disposes the matching line portion on the bump in the bump inspection image so as to match a part of the outline of the bump, and moves and changes the matching line portion so as to approximately match the outline of the bump, thereby determining the outline of the bump.

6. The bump inspection apparatus for IC components as defined in claim 4, wherein
the inspection processing portion calculates an area of an image region formed in a first bump inspection image of the first bump inspection images so as to determine an area of a crushed plane of a vertex portion of a respective bump, and determines if the calculated area is within a reference range of area values.

7. The bump inspection apparatus for IC components as defined in claim 4, wherein
the respective bumps have an approximately conical shape or an approximately conical shape having a crushed plane formed on its vertex portion,
the unidirectional light is radiated onto the vertex portions of the respective bumps, and
the inclined-directional light irradiated is radiated onto lateral faces of the respective bumps.

8. A bump inspection method for IC components, the method comprising:
supporting lower parts of two end portions of a component housing tray, the end portions being opposed to each other, by a pair of support members, the component housing tray housing a plurality of the IC components each having a bump-formation surface with a plurality of bumps formed thereon, the IC components being arranged separately in an array with respective bump-formation surfaces facing up;
holding a horizontal posture of the component housing tray by pressing the end portions of the component housing tray from an upper side so as to correct warp or deflection of the component housing member and to keep an approximately horizontal posture;
selecting one IC component from a plurality of IC components housed in the component housing tray;
acquiring one or more overall images of a bump-formation surface of the IC component;
recognizing a position of the IC component on a basis of the one or more overall images;
setting inspection regions of the respective bumps by positioning the inspection regions on the overall image on a basis of the recognized position and acquiring bump inspection images of the respective bumps from the one or more overall images; and
determining positions of the respective bumps and determining degrees of crush of vertex portions of the respective bumps on a basis of the bump inspection images.

9. The bump inspection method for IC components as defined in claim 8, wherein
acquiring one or more overall images comprises acquiring a first overall image of the IC component while radiating unidirectional light onto the bump-formation surface along a direction approximately orthogonal to the bump-formation surface and acquiring a second overall image of the IC component while radiating light in a plurality of directions from a surrounding of the bump-formation surface toward an approximate center of the bump-formation surface, the respective directions being inclined to the bump-formation surface,
recognizing the position of the IC component is performed on a basis of the first overall image or the second overall image, acquiring the bump inspection images comprises acquiring first bump inspection images of the respective bumps from the first overall image and acquiring second bump inspection images of the respective bumps from the second overall image, and determining positions of the respective bumps is performed on a basis of the first bump inspection images or the second bump inspection images, and determining degrees of crush of the vertex portions of the respective bumps is performed on a basis of the first bump inspection images.

10. The bump inspection method for IC components as defined in claim 9, wherein determining positions of the respective bumps is performed on a basis of the second bump inspection images.

11. The bump inspection method for IC components as defined in claim 9, wherein determining positions of the respective bumps is further performed by detecting outlines of the respective bumps and determining center positions of the outlines as the formation position of the respective bumps, detecting outlines of the respective bumps is performed with use of a step function edge detection template having an initially approximately circular matching line portion, and a plurality of moving-and-changing bars, the moving-and-changing bars being initially set along normal directions to the matching line portion at positions approximately dividing the matching line portion into at least quarters, the moving-and-changing bars being for moving and changing the matching line portion in respective vicinities of the moving-and-changing bars in a direction along the respective moving-and-changing bars, and detecting outlines of the respective bumps comprises:

disposing the matching line portion on bump inspection images so as to match a part of the outlines of the respective bumps in the bump inspection images;

moving and changing the matching line portion so as to approximately match the outlines of the respective bumps in the in the bump inspection images.

12. The bump inspection method for IC components as defined in claim 9, wherein determining degrees of crush comprises:

calculating an area of an image region formed in a first bump inspection image of the first bump inspection images so as to determine an area of a crushed plane of a vertex portion of a respective bump;

determining if the calculated area is within a reference range of area values.

13. The bump inspection method for IC components as defined in claim 9, further comprising:

disposing an approximately annular inspection region about a determined position of a respective bump in a bump inspection image of the bump inspection images;

determining the respective bump has an abnormal shape if a part of an image of the respective bump in the bump inspection image is present in the annular inspection region.

14. A bump formation method for IC components, the method comprising:

feeding back inspection results of the respective bumps for an IC component inspected by the bump inspection method as defined in claim 8 to a bump formation process for forming the respective bumps on the IC component; and in the bump formation process, forming the respective bumps on the respective IC components utilizing the inspection results.

15. An IC component mounting method, the method comprising:

feeding forward inspection results of the respective bumps for an IC component inspected by the bump inspection method as defined in claim 8 to a component mounting process for mounting the IC components to boards; and in the component mounting process, mounting the respective inspected IC components on the boards utilizing the inspection results.

* * * * *

UNITED STATES PATENT AND TRADEMARK OFFICE
CERTIFICATE OF CORRECTION

PATENT NO. : 7,539,338 B2
APPLICATION NO. : 11/137587
DATED : May 26, 2009
INVENTOR(S) : Takayuki Fukae et al.

It is certified that error appears in the above-identified patent and that said Letters Patent is hereby corrected as shown below:

On the Title Page

In Item (56) References Cited, under the "OTHER PUBLICATIONS" heading, the correct page numbers for the Odawara et al. reference should read --pp. 663-665--.

Signed and Sealed this

Thirteenth Day of April, 2010

David J. Kappos
*Director of the United States Patent and Trademark Office*